(12) United States Patent
Park

(10) Patent No.: US 7,663,902 B2
(45) Date of Patent: Feb. 16, 2010

(54) MEMORY DEVICE IN WHICH DATA IS WRITTEN OR READ BY A SWITCHING OPERATION OF A BIT LINE THAT IS INSERTED INTO A TRENCH FORMED BETWEEN A PLURALITY OF WORD LINES

(75) Inventor: Jin-Jun Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 397 days.

(21) Appl. No.: 11/726,867

(22) Filed: Mar. 23, 2007

(65) Prior Publication Data

US 2008/0070401 A1 Mar. 20, 2008

(30) Foreign Application Priority Data

Sep. 18, 2006 (KR) ...................... 10-2006-0089961

(51) Int. Cl.
*G11C 5/06* (2006.01)
(52) U.S. Cl. .................... 365/63; 365/185.05; 365/164; 977/742; 977/943
(58) Field of Classification Search .................. 365/63, 365/185.05, 164; 977/742, 943
See application file for complete search history.

(56) References Cited

U.S. PATENT DOCUMENTS

| 6,100,109 | A | 8/2000 | Melzner et al. |
| 6,548,841 | B2 | 4/2003 | Frazier et al. |
| 6,621,392 | B1 | 9/2003 | Volant et al. |
| 6,924,538 | B2 | 8/2005 | Jaiprakash et al. |
| 6,995,046 | B2 | 2/2006 | Rueckes et al. |
| 7,045,843 | B2 | 5/2006 | Goto et al. |
| 7,056,758 | B2 | 6/2006 | Segal et al. |
| 7,071,023 | B2 | 7/2006 | Bertin et al. |
| 7,511,998 | B2 * | 3/2009 | Lee et al. ............... 365/185.05 |
| 2004/0181630 | A1 | 9/2004 | Jaiprakash et al. |
| 2006/0128049 | A1 | 6/2006 | Jaiprakash et al. |
| 2008/0044954 | A1 * | 2/2008 | Furukawa et al. ........... 438/129 |
| 2008/0144364 | A1 * | 6/2008 | Lee et al. .................... 365/164 |

* cited by examiner

*Primary Examiner*—Tuan T. Nguyen
(74) *Attorney, Agent, or Firm*—Mills & Onello, LLP

(57) ABSTRACT

A memory device and a method for fabricating the same provide a device capable of increasing or maximizing the performance of a microstructure device. The device includes: a plurality of word lines formed with a gap therebetween and extending in parallel with each other in a first direction of extension; and a bit line insulated from the plurality of word lines, intersecting the plurality of word lines and extending in a second direction of extension, a transition electrode portion of the bit line positioned in the gap and spaced apart from the plurality of word lines by a predetermined distance, the transition electrode portion of the bit line configured and arranged to be bent toward any one of the plurality of word lines in response to an electrical signal applied to at least one of the plurality of word lines.

17 Claims, 31 Drawing Sheets

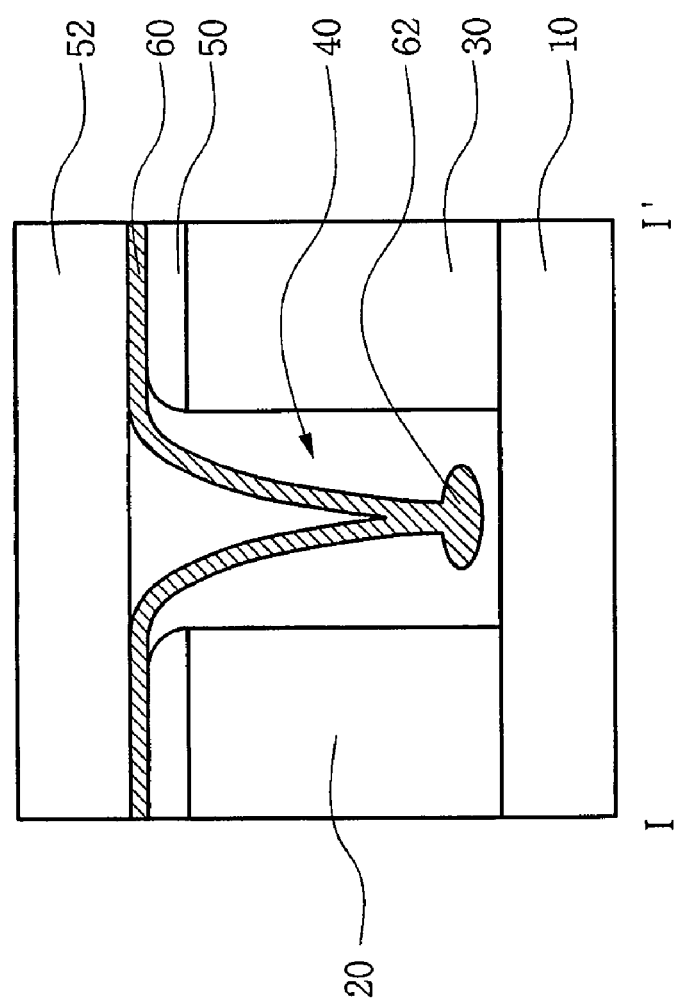

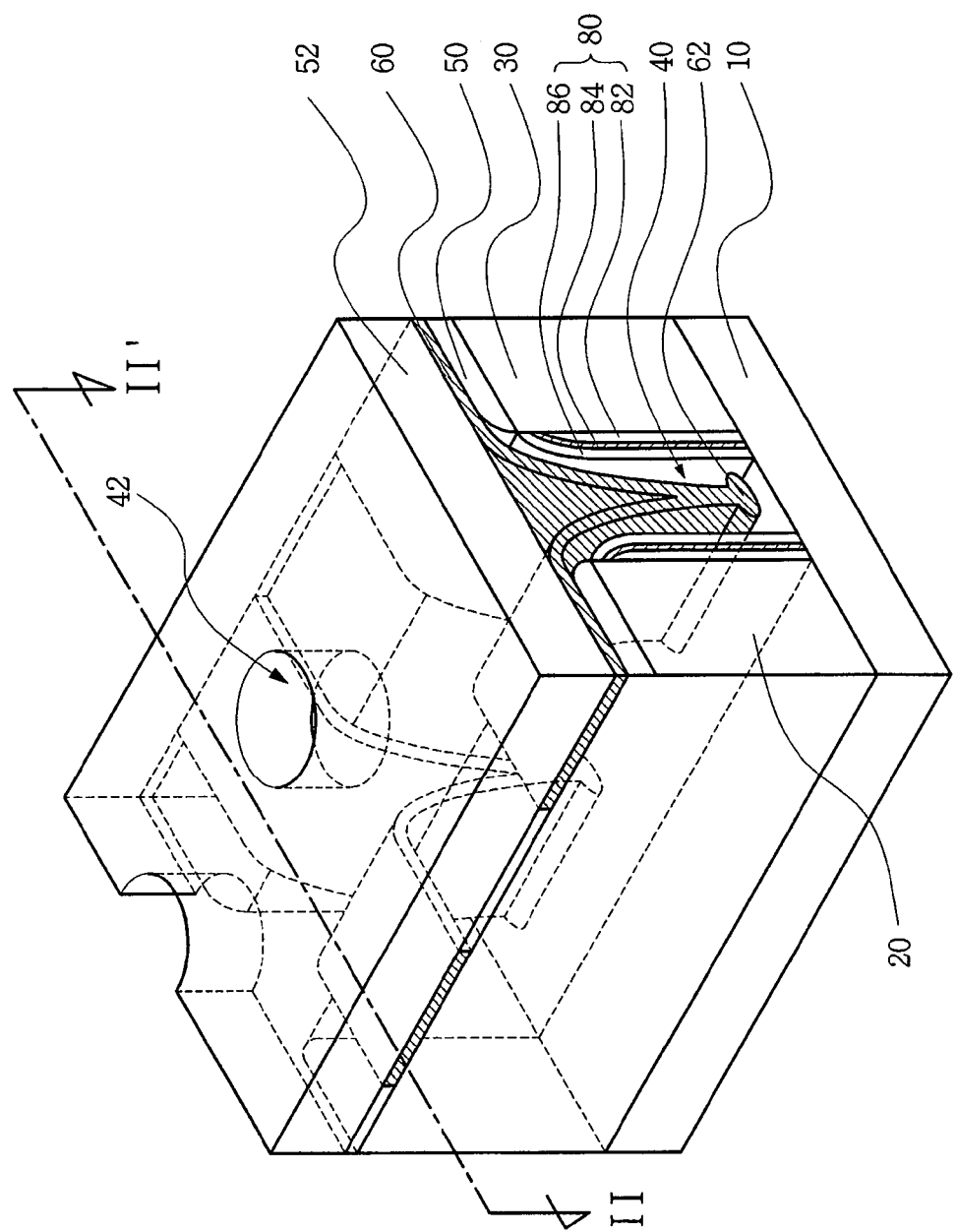

MEMORY DEVICE IN WHICH DATA IS WRITTEN OR READ BY A SWITCHING OPERATION OF A BIT LINE THAT IS INSERTED INTO A TRENCH FORMED BETWEEN A PLURALITY OF WORD LINES

CROSS-REFERENCE TO RELATED APPLICATION

This application claims priority to Korean Patent Application No. 10-2006-0089961, filed Sep. 18, 2006, the disclosure of which is hereby incorporated herein by reference in its entirety.

BACKGROUND OF THE INVENTION

1. Technical Field

The present invention relates to a memory device and a method for fabricating the same, and more particularly, to a memory device in which data is written or read by a switching operation of a bit line that is inserted into a trench formed between a plurality of word lines, and a method for fabricating the same.

2. Discussion of Related Art

In general, memory devices for storing data can be classified as volatile memory devices and nonvolatile memory devices. Among memory devices, a volatile memory device, such as a dynamic random access memory (DRAM) or a static random access memory (SRAM), has a relatively high data input/output speed, but loses stored data when the power supply is removed. A nonvolatile memory semiconductor device, such as an erasable programmable read only memory (EPROM) or an electrically erasable programmable read only memory (EEPROM) has a relatively low data input/output speed, but retains data even when the power supply is removed.

Meanwhile, such a conventional memory device commonly includes a metal oxide semiconductor field effect transistor (MOSFET) based on metal oxide semiconductor (MOS) technology. For example, stacked gate type transistor memory devices stacked on a silicon semiconductor substrate and trench gate type transistor memory devices buried in the semiconductor substrate are under development. However, the MOSFET requires a channel having a suitable width and length over a certain substrate area to prevent a short channel effect, and requires that a gate insulating layer formed between a gate electrode on the channel and the semiconductor substrate has a significantly small thickness. Thus, it is difficult to implement a MOSFET-based memory device of a nano-scale microstructure.

For this reason, memory devices for substituting for the MOSFET are being actively studied. In contemporary semiconductor technology, micro electromechanical system (MEMS) and a nano electromechanical system (NEMS) are being developed and used. Among them, a memory device having a carbon nanotube structure is disclosed in U.S. Pat. No. 6,924,538 entitled "Devices Having Vertically-disposed Nanofabric Articles and Methods of Making," incorporated herein by reference.

A conventional memory device in accordance with the above carbon nanotube structure will now be described with reference to FIGS. 1 and 2. FIGS. 1 and 2 are cross-sectional views illustrating a conventional memory device. Referring to FIGS. 1 and 2, a conventional memory device includes a plurality of electrodes 304 and 306 having a predetermined channel or gap interposed therebetween, and a nanotube piece 308 vertically passing through the channel or gap at a spacing from the plurality of electrodes 304 and 306 and, and storing data as the nanotube piece 308 is brought into contact with one of the plurality of electrodes 304 and 306 or separated from the electrodes.

The plurality of electrodes 304 and 306 are formed to be symmetrical to each other with respect to the nanotube piece 308, the ends of which are anchored at a center of the channel or gap in a horizontal direction. For example, the plurality of electrodes 304 and 306 are formed of a conductive metal or a semiconductor material. Insulating support structures support the plurality of electrodes 304 and 306, while insulating upper and lower portions of the nanotube piece 308 inserted into the channel or gap formed between the plurality of electrodes 304 and 306 from the electrodes 304, 306.

The nanotube piece 308 may vertically pass through the channel or gap formed between the plurality of electrodes 304 and 306 and be brought into contact with any one of the plurality of electrodes 304 and 306 under a predetermined condition. For example, the conventional memory device can store one-bit data corresponding to a structure 310 in which the nanotube piece 308 is bent toward and brought into contact with the first electrode 304 of the plurality of electrodes 304 and 306 to which a charge having an opposite polarity to charge applied to the nanotube piece 308 are applied and a structure 314 in which it is bent toward and brought into contact with the second electrode 306. However, standby power is required to sustain the electrical contact between the nanotube piece 308 and the plurality of electrodes 304 and 306. Accordingly, it is difficult to implement a nonvolatile memory device using this configuration.

A method for fabricating such a conventional memory device will now be described. First, the first electrode 304 is formed on an insulating substrate. A trench (not shown) exposing the insulating substrate at one side of the first electrode 304 is then formed.

A first sacrificial layer (not shown), the nanotube piece 308, and a second sacrificial layer (not shown) are stacked to a predetermined thickness on sidewalls of the trench, and a first insulating support (not shown) is formed to a predetermined thickness on the bottom of the trench.

Then, the first sacrificial layer and the second sacrificial layer may be removed and the second electrode 306 spaced apart from the nanotube piece 308 by a predetermined distance may be formed on the first insulating support inside the trench. However, it is difficult to from the second electrode 306 spaced apart by a predetermined distance from the nanotube piece 308, which is exposed to the sidewalls of the trench. For example, even though a mask layer for forming the second electrode 306 is formed on the trench, it is difficult to vertically form a conductive metal layer stacked at a certain interval relative to the nanotube piece 308 inside the trench. That is, it is difficult to form the second electrode 306 in a symmetrical structure, which is opposite to the first electrode 304 with predetermined channels or gaps formed at both sides of the nanotube piece 308.

Increase in the protruding distance of the mask layer from a top end of the sidewall of the trench leads to increase in the distance between the second electrode 306 and the nanotube piece 308, requiring a greater electrical attractive force for contact between the first electrode 304 or the second electrode 306 and the nanotube piece 308. Accordingly, a large amount of power can be consumed for writing data to the conventional memory device.

As described above, the conventional memory device described above and a method for fabricating the same have the following problems.

First, it is difficult to form the second electrode 306, which is formed inside the trench exposed by the first electrode 304 on the insulating substrate, to be symmetrical with respect to the nanotube formed at a predetermined distance from the sidewall of the trench. Thus, reliability and production yield are degraded.

Second, the distance between the second electrode 306 and the first electrode 304 at both sides of the nanotube increases in proportion to the distance by which the mask layer used for forming the second electrode 306 inside the trench protrudes from the sidewall of the trench, and consumption of power required for data writing increases due to increase in the bending distance of the nanotube. Thus, efficiency is degraded.

Third, charge must be continuously supplied to either the nanotube piece 308 or the plurality of electrodes 304 and 306 in order to maintain the contact between any one of the plurality of electrodes 304 and 306 and the nanotube piece 308. Accordingly, standby power consumption increases. When the charge supply is removed, information corresponding to the contact state of the nanotube piece 308 cannot be maintained. Thus, it is impossible to implement a nonvolatile memory device.

SUMMARY OF THE INVENTION

Embodiment of the present invention provide a memory device and a method for fabricating the same in which a plurality of lines or electrodes symmetrical over a predetermined distance with respect to a line for switching operation can be readily formed, thereby increasing or maximizing reliability and production yield.

Another object of the present invention is to provide a memory device and a method for fabricating the same in which a bending distance of a line for switching operation and consumption of power required for data writing corresponding to the bending distance of the line can be reduced, thereby increasing or maximizing device efficiency.

Still another object of the present invention is to provide a memory device having a nonvolatile characteristic by reducing consumption of standby power required for maintaining stored information and preventing information loss even when external charge is not supplied.

In one aspect, a memory device comprises: a plurality of word lines formed with a gap therebetween and extending in parallel with each other in a first direction of extension; and a bit line insulated from the plurality of word lines, intersecting the plurality of word lines and extending in a second direction of extension, a transition electrode portion of the bit line positioned in the gap and spaced apart from the plurality of word lines by a predetermined distance, the transition electrode portion of the bit line configured and arranged to be bent toward any one of the plurality of word lines in response to an electrical signal applied to at least one of the plurality of word lines.

The transition electrode portion of the bit line can comprise a clock-pendulum-shaped or medal-shaped tip inserted into the gap.

The tip of the transition electrode portion of the bit line can include lateral extensions that extend in a direction toward at least one of the plurality of word lines.

The device can further comprise charge trapping structures formed on sidewalls of the plurality of word lines in the gap between the plurality of word lines and the transition electrode portion of the bit line, wherein the charge trapping structures trap charge so that the transition electrode portion of the bit line can be retained in a bent position toward any one of the plurality of word lines in an electrostatically fixed manner.

The memory device can comprise a non-volatile memory device and the charge trapping structures can trap charge so that the transition electrode portion of the bit line can be retained in a bent position toward any one of the plurality of word lines in an electrostatically fixed manner, despite removal of a power supply that supplies power to the device.

In another aspect, a memory device comprises: a substrate; a plurality of word lines on the substrate and spaced apart from each other by a predetermined interval and extending in parallel with each other in a first direction of extension on the substrate; a trench exposing the substrate between the plurality of word lines; a first interlayer insulating film on the plurality of word lines; and a bit line on the first interlayer insulating film intersecting the plurality of word lines and extending in a second direction of extension, the bit line insulated from the plurality of word lines by the first interlayer insulating film, a transition electrode portion of the bit line positioned in the trench and spaced apart from the plurality of word lines by a predetermined distance, the transition electrode portion of the bit line configured and arranged to be bent toward any one of the plurality of word lines in response to an electrical signal applied to the at least one of the plurality of word lines.

The transition electrode portion of the bit line can comprise a clock-pendulum-shaped or a medal-shaped tip.

The tip of the transition electrode can include lateral extensions that extend in a direction toward at least one of the plurality of word lines.

The device can further comprise charge trapping structures formed on sidewalls of the plurality of word lines in the trench between the plurality of word lines and the transition electrode portion of the bit line, wherein the charge trapping structures trap charge so that the transition electrode portion of the bit line can be retained in a bent position toward any one of the plurality of word lines in an electrostatically fixed manner.

The memory device can comprise a non-volatile memory device and the charge trapping structures can trap charge so that the transition electrode portion of the bit line can be retained in a bent position toward any one of the plurality of word lines in an electrostatically fixed manner, despite removal of a power supply that supplies power to the device.

The charge trapping structure can comprise a first silicon oxide layer, a silicon nitride layer or polysilicon layer, and a second silicon oxide layer sequentially stacked on sidewalls of the trench.

The charge trapping structure can be in a circular arc shape that protrudes from the both sidewalls of the trench or can be in a rod shape that is in parallel with the plurality of word lines.

The substrate can comprise an insulating substrate or a semiconductor substrate.

The first interlayer insulating film can comprise a silicon oxide layer or a silicon nitride layer.

The bit line can comprise titanium, titanium nitride layer, or carbon nanotube.

The plurality of word lines can comprise gold, silver, copper, aluminum, tungsten, tungsten silicide, titanium, titanium nitride, tantalum, or tantalum silicide.

The device can further comprise a second interlayer insulating film that covers an entire surface of the substrate wherein a gap is present between the second interlayer insulating film and the transition electrode portion of the bit line in the trench.

In another aspect, a method for fabricating a memory device comprises: forming first and second word lines in parallel with each other on a substrate and extending in a first direction on the substrate, and forming a first interlayer insulating film on the first and second word lines; forming a first sacrificial layer to a predetermined thickness on sidewalls and a bottom of a first trench formed between the first word line and the second word line; forming a bit line having a predetermined line width on the first sacrificial layer in the first trench and on the first interlayer insulating film, a transition electrode portion of the bit line positioned in the first trench, the bit line extending in a second direction on the substrate; forming a second interlayer insulating film to a predetermined thickness on the substrate including the bit line; forming a second trench exposing the first sacrificial layer by removing a portion of the second interlayer insulating film spaced apart by a predetermined distance from an edge of the bit line on the first trench; and forming a gap in the trench by isotropically removing the first sacrificial layer through the second trench so that the transition electrode portion of the bit line is spaced apart from the plurality of word lines by a predetermined distance and is suspended above a bottom portion of the trench.

The method can further comprise, before forming the first sacrificial layer, forming charge trapping structures each including a first silicon oxide layer, a silicon nitride layer or polysilicon layer, and a second silicon oxide layer, which are sequentially stacked on both sidewalls of the first trench.

The charge trapping structure can be formed in a circular arc shape by etching the first silicon oxide layer, the silicon nitride layer or polysilicon layer, and the second silicon oxide layer on the both sidewalls of the first trench by a self-alignment anisotropic dry etching process.

In the method, before the first interlayer insulating film is formed, the charge trapping structures can be formed on both sidewalls of the first trench formed between the first word line and the second word line.

Further, a portion of the first sacrificial layer formed on the bottom of the first trench may be formed in a pool shape.

The method can further comprise, after forming the bit line, forming a second sacrificial layer surrounding a top and side surfaces of the transition electrode portion of the bit line inside the first trench and burying a side surface of the bit line on the first interlayer insulating film.

Furthermore, the second sacrificial layer can be removed in the forming of the gap.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIG. 4 is a cross-sectional view taken along line I-I' of FIG. 3;

FIG. 7 is a perspective view illustrating a memory device according to a second embodiment of the present invention;

DETAILED DESCRIPTION OF EMBODIMENTS OF THE INVENTION

Figure 1:
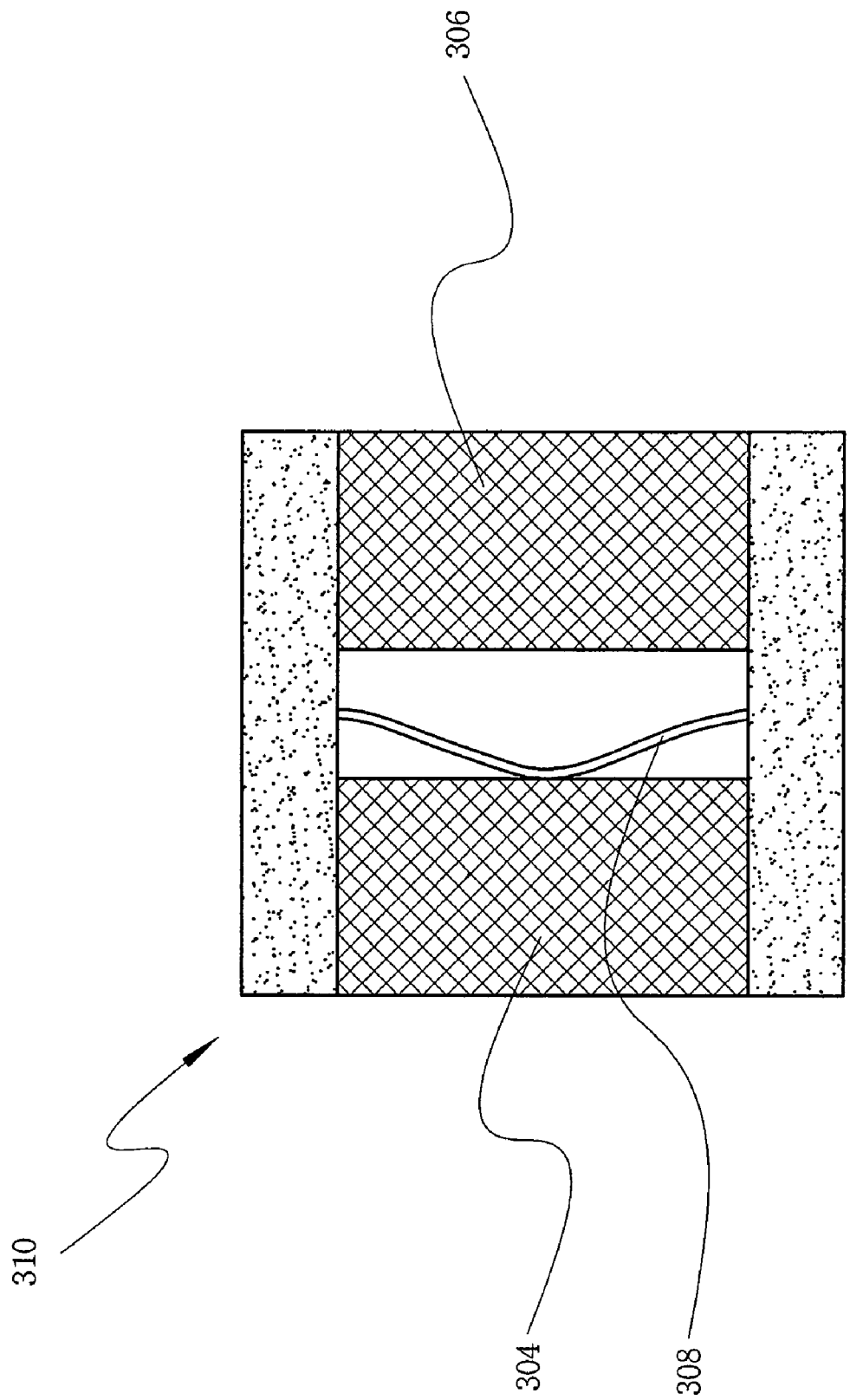
FIGS. 1 and 2 are cross-sectional views illustrating a conventional memory device.
Figure 2:
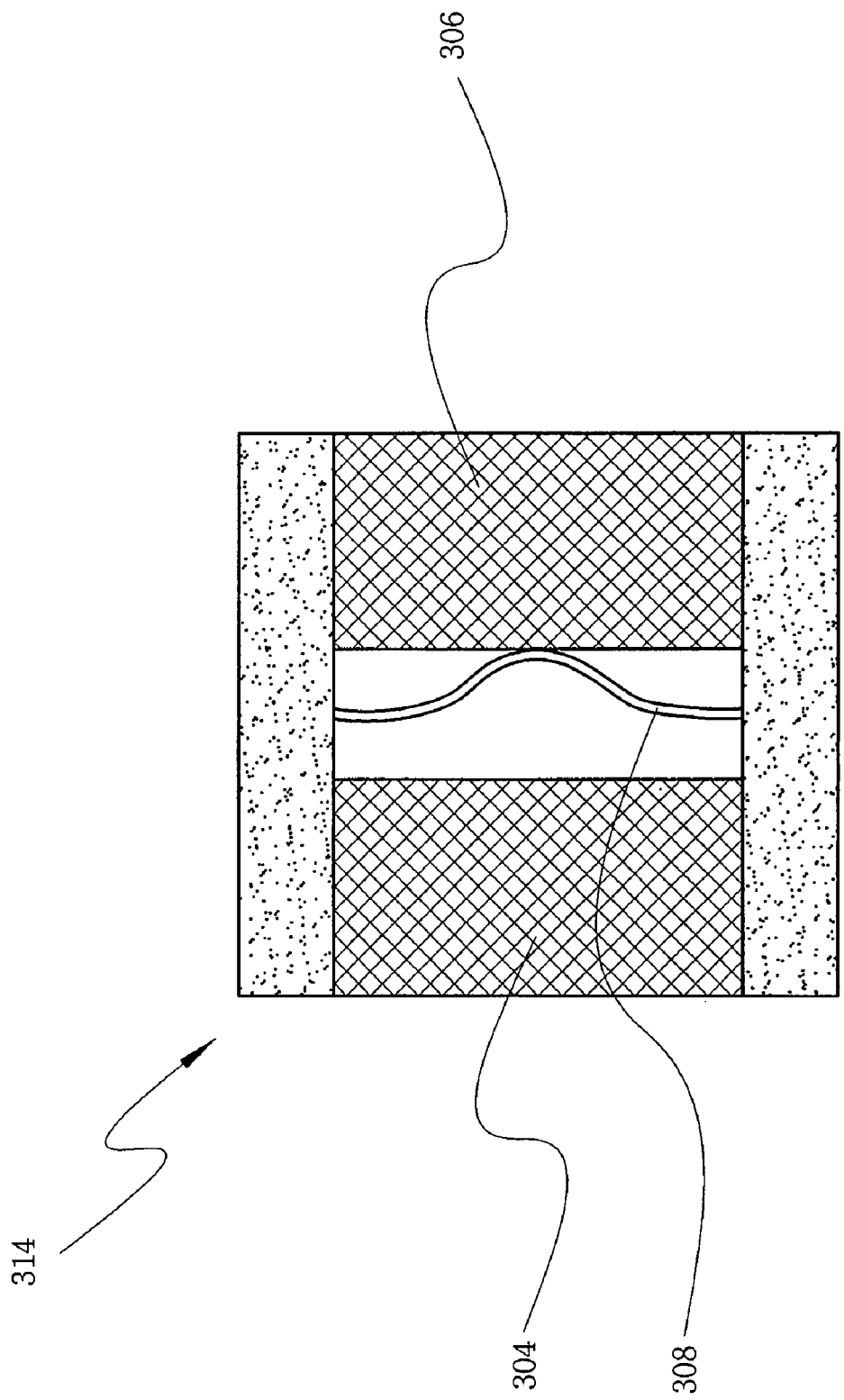

Embodiments of the present invention will now be described more fully hereinafter with reference to the accompanying drawings, in which preferred embodiments of the invention are shown. The invention may, however, be embodied in different forms and should not be construed as limited to the embodiments set forth herein. Rather, the embodiments are provided as teaching examples of the invention. Like numbers refer to like elements. In the drawings, thicknesses of layers and areas are highlighted for clarity, and when any layer is described as being "on" another layer or a substrate, the layer may be directly on another layer or a substrate or a third layer or substrate may be interposed therebetween.

Figure 3:
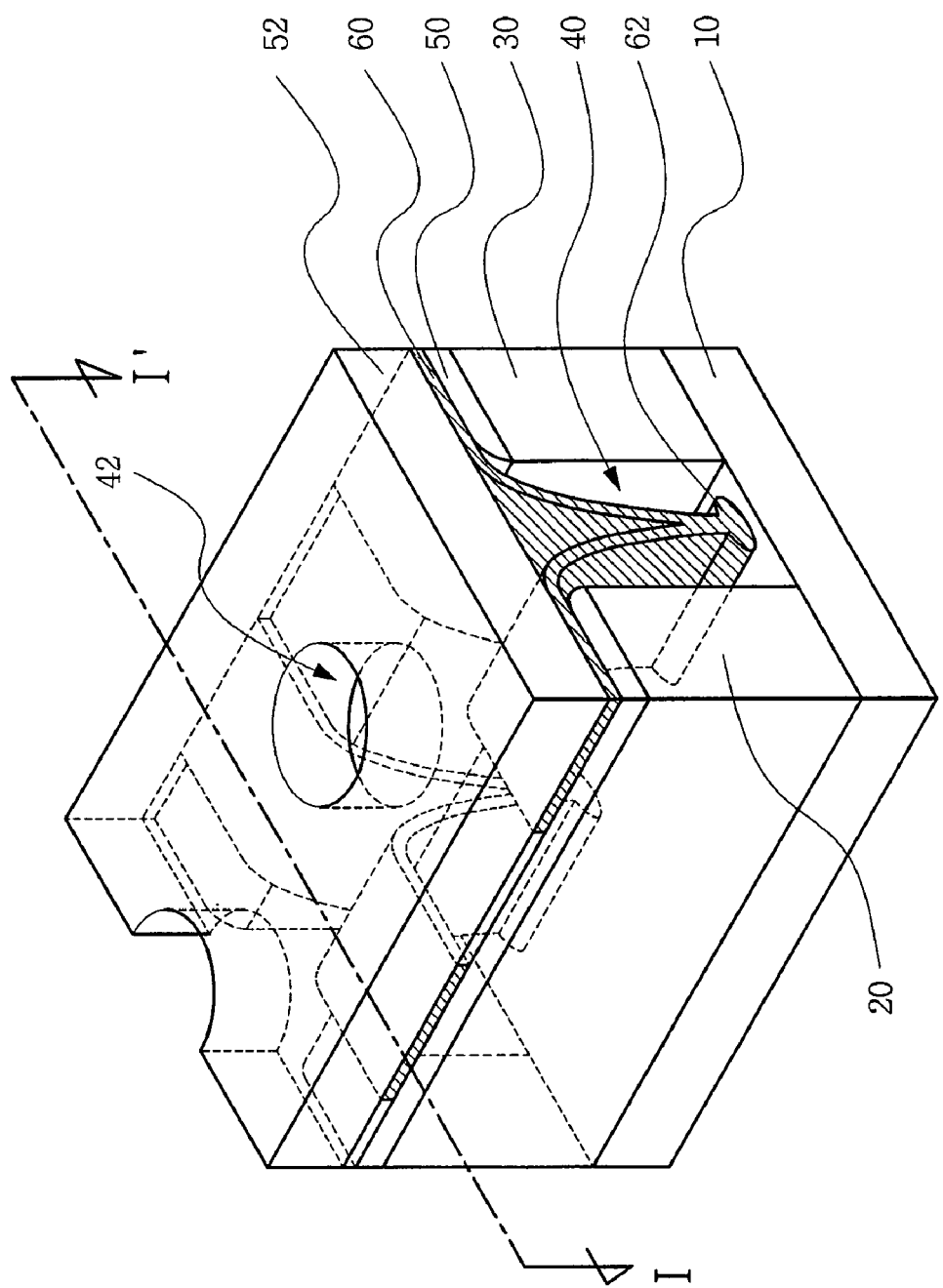
FIG. 3 is a perspective view illustrating a memory device according to a first embodiment of the present invention.

FIG. 3 is a perspective view illustrating a memory device according to a first embodiment of the present invention, and FIG. 4 is a cross-sectional view taken along line I-I' of FIG. 3.

Referring to FIGS. 3 and 4, a memory device according to the first embodiment of the present invention includes a substrate 10 having a generally flat upper surface, first and second word lines 20 and 30 formed in parallel with each other and at a certain interval from each other on the substrate 10, a first trench 40 formed between the first word line 20 and the second word line 30 and exposing the substrate 10, a first interlayer insulating film 50 formed on the first and second word lines 20 and 30 excluding the first trench 40, and a bit line 60 inserted into the first trench 40 while intersecting the first and second word lines 20 and 30 with the first interlayer insulating film 50 therebetween as an insulator, spaced apart by a predetermined distance from the first and second word lines 20 and 30 in the first trench 40, and being either in a bent position toward either the first word line 20 or the second word line 30 in the first trench 40 by an electrical signal applied to the first and second word lines 20 and 30, or in a rest position between the first and second word lines 20, 30.

The memory device further includes a second interlayer insulating film 52 forming a gap with the bit line 60 on the first trench 40 and formed on an entire surface of the substrate 10 having the bit line 60, and a second trench 42 formed by removing the second interlayer insulating film 52 on the first trench 40 adjacent to both edges of the bit line 60 to expose the substrate 10.

The substrate 10 has a flat upper surface and the first and second word lines 20 and 30 are formed in parallel with each other in one direction on the substrate. For example, the substrate 10 includes an insulating substrate or a semiconductor substrate having excellent flexibility to be bent by external force.

The first and second word lines 20 and 30 are formed to a predetermined thickness and in parallel with each other on the substrate 10. The first and second word lines 20 and 30 are formed of a material having excellent electrical conductivity. For example, the first and second word lines 20 and 30 may be formed of a conductive metal layer having excellent conductivity, such as gold, silver, copper, aluminum, tungsten, tungsten silicide, titanium, titanium nitride, tantalum, or tantalum silicide.

The first and second word lines 20 and 30 may be patterned to have a predetermined line width using the first overlying interlayer insulating film 50 as an etch mask. Alternatively, the first and second word lines 20 and 30 may be patterned using a first hard mask layer (not shown) stacked on the first interlayer insulating film 50 as an etch mask. The first interlayer insulating film 50 may be formed as a separate layer beneath the first hard mask layer or as the first hard mask layer. For example, when the first interlayer insulating film 50 is formed as the first hard mask layer, the first interlayer insulating film 50 may be formed of a silicon nitride layer. Alternatively, when the first interlayer insulating film 50 may be formed as a separate layer beneath the first hard mask layer, it may include a silicon oxide layer beneath the first hard mask layer that is formed as a silicon nitride layer. Accordingly, the first interlayer insulating film 50 is located on the first and second word lines 20 and 30 and used as an etch mask for patterning the first trench 40. The first interlayer insulating film 50 insulates the first and second word lines 20 and 30 and the bit line 60.

The first trench 40 has such a width and depth that a straight distance between the first word line 20 and the second word line 30 and a bending distance of the bit line 60 inserted between the first word line 20 and the second word line 30 have a predetermined correlation. For example, the width of the first trench 40 defines the distance between the first word line 20 and the second word line 30 and a traveling distance of the bit line 60 between the two word lines 20, 30, and the depth of the first trench 40 corresponds to a thickness of the first and second word lines 20 and 30 and the first interlayer insulating film 50 and may limit the length of the bit line 60 inserted between the first word line 20 and the second word line 30. Accordingly, as the width of the first trench 40 decreases, the bending distance of the bit line 60 can decrease and the integration of the memory device can increase. As the thickness of the first and second word lines 20 and 30 or the height of the first interlayer insulating film 50 on the first and second word lines 20 and 30 increases, the integration of the memory device can increase.

The bit line 60 is located on the first interlayer insulating film 50 and planarized while intersecting the first and second word lines 20 and 30. The bit line 60 is supported by the first interlayer insulating film 50 located on the first and second word lines 20 and 30 and floats in the first trench 40 and to a predetermined height from the substrate 10. For example, the bit line 60 is supported by the first interlayer insulating film 50 at both upper ends of the first trench 40 and inserted into the first trench 40. In addition, the bit line 60 has a clock-pendulum-shaped, or medal-shaped, tip 62, having lateral extensions, that is adjacent to a bottom of the first trench 40 and is suspended above the bottom of the first trench 40 by a predetermined height. In this case, the tip 62 of the bit line 60 may correspond to a contact point that is brought into electrical contact with sidewalls of the first and second word lines 20 and 30, which are exposed to inner walls of the first trench 40.

Although not shown in FIG. 3, the memory device according to the first embodiment of the present invention further is formed using a first sacrificial layer (70 of FIG. 5b) formed to a predetermined thickness on the sidewalls and bottom of the first trench 40 and used as a mold for the bit line 60 in the first trench 40; and using a second sacrificial layer (72 of FIG. 5d) stacked on the first sacrificial layer 70 formed in the first trench 40 and the bit line 60, and removed together with the first sacrificial layer 70 by an etching solution or an etching gas supplied through the second trench 42, which is formed on both sides of the edges of the bit line 60.

The bit line 60 is formed of a conductor having a predetermined elasticity to freely move in a horizontal direction due to an electrical field induced in a gap formed in the first trench 40 between the bit line 60 and the first word line 20 or the second word line 30. For example, the bit line 60 can be formed of a titanium, titanium nitride, or carbon nanotube material. In the case of a carbon nanotube material, the carbon nanotube is in a tubular shape in which hexagon structures each including six carbon atoms are connected to one another. This tube is referred to as a carbon nanotube since its diameter is only several or tens of nanometers. Furthermore, the carbon nanotube has a similar electrical conductivity with that of copper, the same thermal conductivity as diamond which has the most excellent thermal conductivity, one-hundred times greater strength than steel, and a high restoring force since the carbon nanotube can withstand 15% deformation, unlike a carbon fiber that can be broken even by deformation as small as 1%.

The bit line 60 formed in the first trench 40 can be bent left or right by an electrical field induced in the gap between the bit line 60 and the first word line 20 or the second word line 30 when a predetermined amount of charge is applied, and brought into electrical contact with the first word line 20 or the second word line 30. For example, the bit line 60 may be bent by a Coulomb's force expressed by Equation 1:

$$F = -k\frac{q_1 q_2}{r^2} = -q_1 E, \qquad \text{Equation 1}$$

where: "k" denotes a Coulomb's force constant; "$q_1$" denotes charge applied to the bit line 60 and "$q_2$" denotes charge applied to the first word line 20 or the second word line 30; "r" denotes a straight distance between the bit line 60 and the first word line 20 or a straight distance between the bit line 60 and the second word line 30; and "E" denotes an electrical field induced between the bit line 60 and the first word line 20 or between the bit line 60 and the second word line 30. According to the Coulomb's force, when $q_1$ and $q_2$ have an opposite polarity, they may attract each other due to an attractive force therebetween. On the other hand, when $q_1$ and $q_2$ have the same polarity, they may repel each other due to a repulsive force therebetween. Accordingly, one-bit digital information may be written or read in which the information includes '0' indicating that the bit line 60 is in electrical contact with the first word line 20 and '1' indicating that the bit line 60 is in electrical contact with the second word line 30.

Write and read operations of the memory device according to the first embodiment of the present invention will now be described. First, when charge having a different polarity is applied to the bit line 60 and the first word line 20 respectively, the bit line 60 is bent, to be brought into electrical contact with the first word line 20, due to an attractive force therebetween, such that information corresponding to '0' may be written. In this case, charge having the same polarity as that of the charge applied to the bit line 60 may be applied to the second word line 30, opposite the first word line 20 so that a repulsive force is exerted between the second word line 30 and the bit line 60. Further, as the bit line 60 becomes closer in proximity to the first word line 20, a greater Coulomb's force is exerted between the bit line 60 and the first word line 20. Accordingly, the bit line 60 and the first word line 20 can be readily brought into contact with each other. For example, the bit line 60 and the first word line 20 can be readily brought into contact with each other by forming the clock-pendulum-shaped or medal-shaped tip 62, having lateral extensions, of the bit line 60 inserted into the first trench 40 so that the straight distance between the bit line 60 and the first word line 20 becomes smaller and an electrical field induced between the bit line 60 and the first word line 20 becomes greater. Information corresponding to the electrical contact between the bit line 60 and the first word line 20 may be written by supplying charge having a different polarity to the bit line 60 and the first word line 20. Furthermore, when the bit line 60 and the first word line 20 are in electrical contact with each other, this electrical contact may be sustained only if charge having a different polarity, and more than a certain intensity, is supplied to the bit line 60 and the first word line 20. This is because an electrostatic force represented by the Coulomb's force is at least several ten-thousand times stronger than a normal elastic force or restoring force of the body of the bit line 60 and sustains the contact between the bit line 60 and the first word line 20 against the elastic/restoring force of the bit line 60.

Similarly, when charge having a different polarity is applied to the bit line 60 and the second word line 30 respectively, the bit line 60 is bent, to be brought into electrical contact with the second word line 30 due to an attractive force therebetween, such that information corresponding to '1' is written. Further, charge having the same polarity as that of the charge applied to the bit line 60 may be applied to the first word line 20 so that a repulsive force is exerted between the first word line 20 and the bit line 60.

In this manner, the memory device according to the first embodiment of the present invention can store one-bit information corresponding to a state where the bit line 60 inserted into the first trench 40 formed between the first word line 20 and the second word line 30 is in electrical contact with the first word line 20 or the second word line 30.

Further, information corresponding to '0' and '1' may be read by identifying a state where the bit line 60 and the first word line 20 are brought into electrical contact with each other or a state where the bit line 60 and the second word line 30 are brought into electrical contact with each other.

Meanwhile, during fabrication, the bit line 60 is covered with the second interlayer insulating film 52 formed on the bit line 60 and the second sacrificial layer 72, to define the shape of the bit line 60 so that the bit line 60 has flexibility inside the first trench 40. This is because a gap is formed between the bit line 60 and the second interlayer insulating film 52 by removing the second sacrificial layer 72 formed in or on the first trench 40.

In this case, the second trench 42 is formed to expose the second sacrificial layer 72 formed between the second interlayer insulating film 52 and the bit line 60, to the sidewalls thereof, and allows inflow of the etching solution or etching gas for removing the second sacrificial layer 72 and the first sacrificial layer 70 in order to form the gap between the bit line 60 and the second interlayer insulating film 52.

Thus, in the memory device according to the first embodiment of the present invention, the clock-pendulum-shaped or medal-shaped tip 62, having lateral extensions, of the bit line 60 is inserted into the gap formed in the first trench 40 between the first and second word lines 20 and 30 formed in parallel with each other on the substrate 10, and the first and second word lines 20 and 30 are symmetrical to each other with respect to the bit line 60.

A method for fabricating the memory device according to the first embodiment of the present invention will now be described.

FIGS. 5A to 5G and 6A to 6G are perspective views and cross-sectional views illustrating a method for fabricating the memory device of FIGS. 3 and 4. In FIGS. 6A to 6G, the cross-sectional views taken from FIGS. 5A to 5G are sequentially illustrated.

Figure 5A:
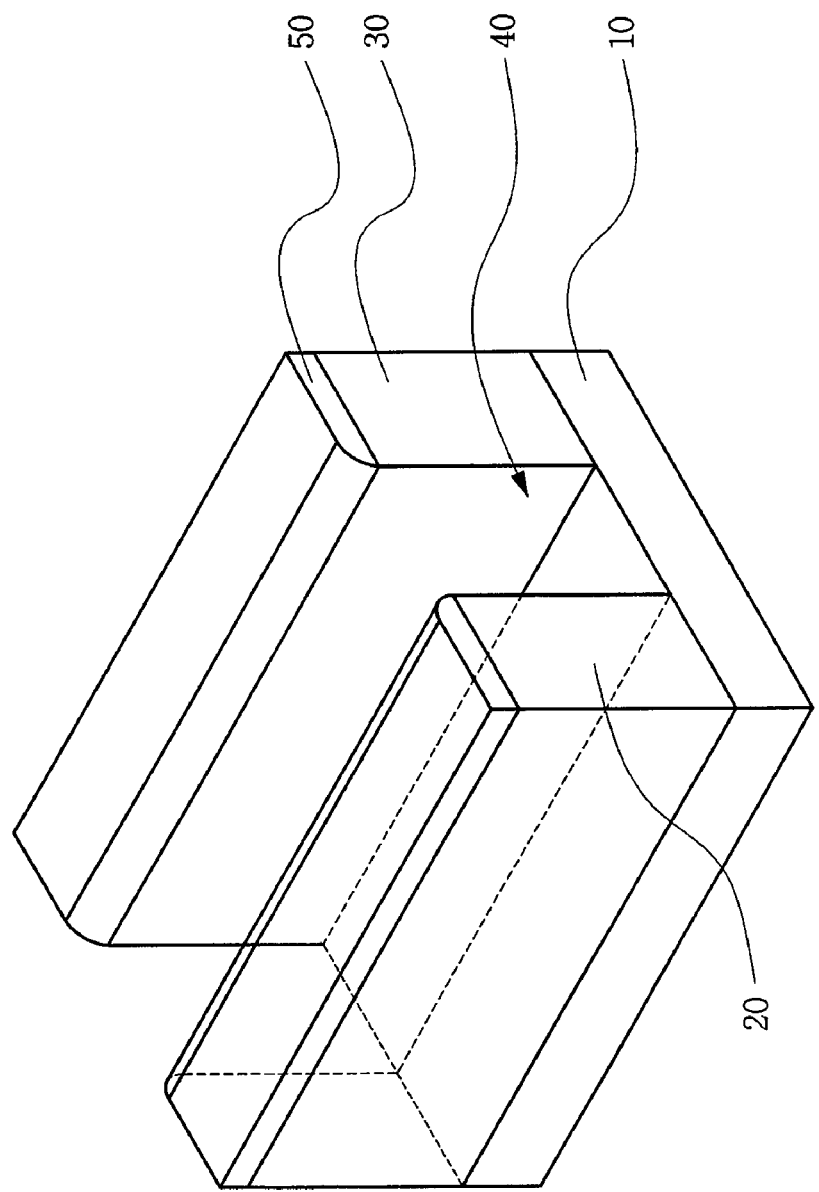
FIGS. 5A to 5G and 6A to 6G are perspective views and cross-sectional views respectively illustrating a method for fabricating the memory device of FIGS. 3 and 4.
Figure 6A:
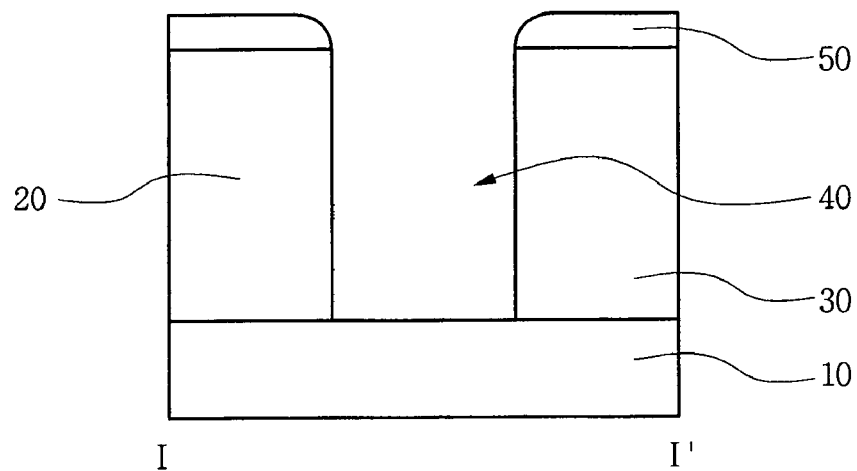

Referring to FIGS. 5A and 6A, the first and second word lines 20 and 30 are formed to a predetermined thickness and in parallel with each other on the substrate 10 having substantially flat upper surface, and the first interlayer insulating film 50 is formed on the first and second word lines 20 and 30. Here, the first and second word lines 20 and 30 are formed to a predetermined height and at a certain spacing on the substrate 10. The first trench 40, having a bottom, is formed which exposes the substrate 10 between the first word line 20 and the second word line 30. The first interlayer insulating film 50 is divided into two portions, each located on the first and second word lines 20 and 30. A process of forming the first and second word lines 20 and 30 and the first interlayer insulating film 50 will be described by way of example. First, a conductive metal layer such as gold, silver, copper, aluminum, tungsten, tungsten silicide, titanium, titanium nitride, tantalum, or tantalum silicide is formed on the substrate 10 by physical vapor deposition or chemical vapor deposition, and a silicon oxide layer or silicon nitride layer is stacked on the conductive metal layer by a tetraethyl orthosilicate (TEOS), undoped silicate glass (USG), spin on glass (SOG), or high density plasma chemical vapor deposition (HDP-CVD) process. The silicon oxide layer and the conductive metal layer are anisotropically removed to a predetermined line width through a dry etching process using a photoresist pattern or a first hard mask layer shielding the silicon oxide layer and the conductive metal layer as an etch mask layer, resulting in the first and second word lines 20 and 30 and the first interlayer insulating film 50. In this case, a reactive gas used in the dry etching process contains a fluorocarbon gas such as a CxFy gas consisting of $CF_4$, $CHF_3$, $C_2F_6$, $C_4F_8$, $CH_2F_2$, $CH_3F$, $CH_4$, $C_2H_2$, and $C_4F_6$, a CaHbFc gas, or the like, and a strong acid gas including a mixture of a sulphuric acid and nitric acid. Furthermore, the first and second word lines 20 and 30 are formed to a thickness of about 500 angstroms to about 1500 angstroms and a line width of about 30 angstroms to about 500 angstroms, and the first trench 40 having a width of about 100 angstroms to about 500 angstroms is formed between the first word line 20 and the second word line 30. The first interlayer insulating film 50 is formed to a thickness of about 200 angstroms to about 850 angstroms.

Figure 5B:
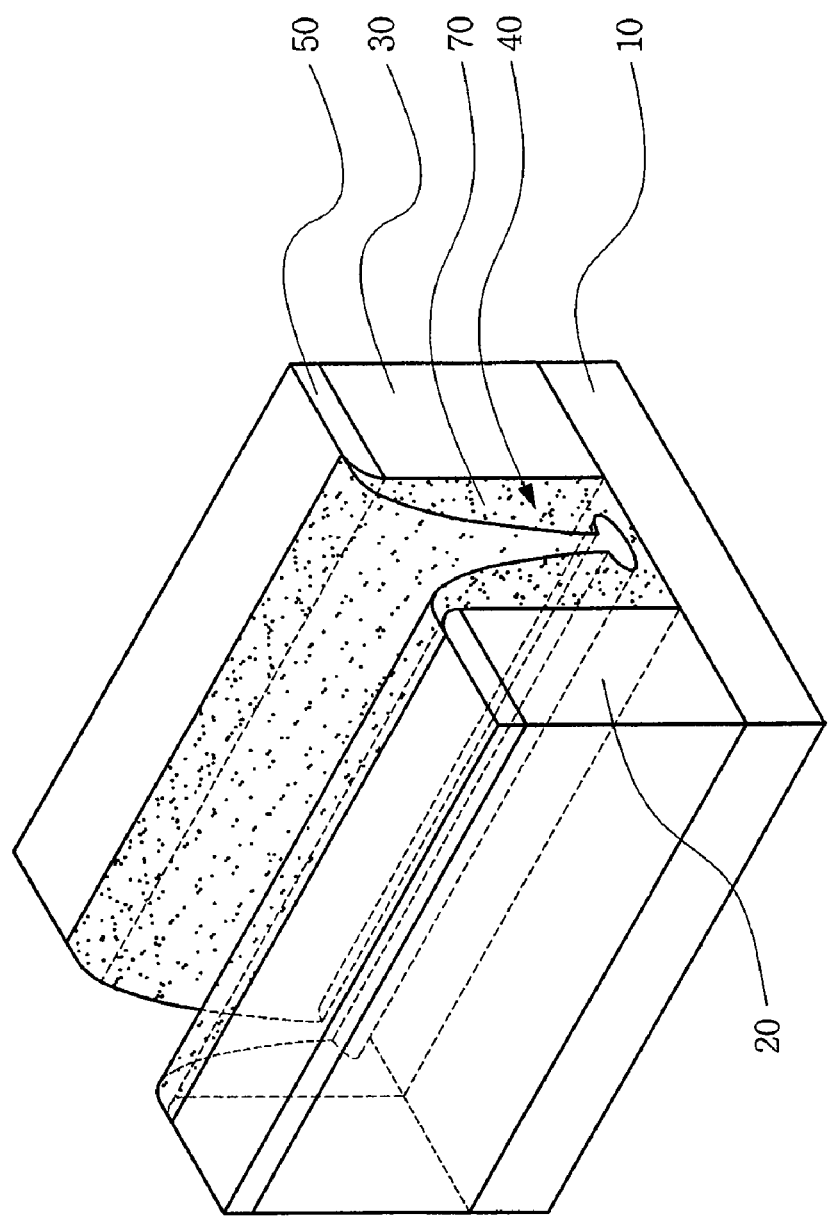
Figure 6B:
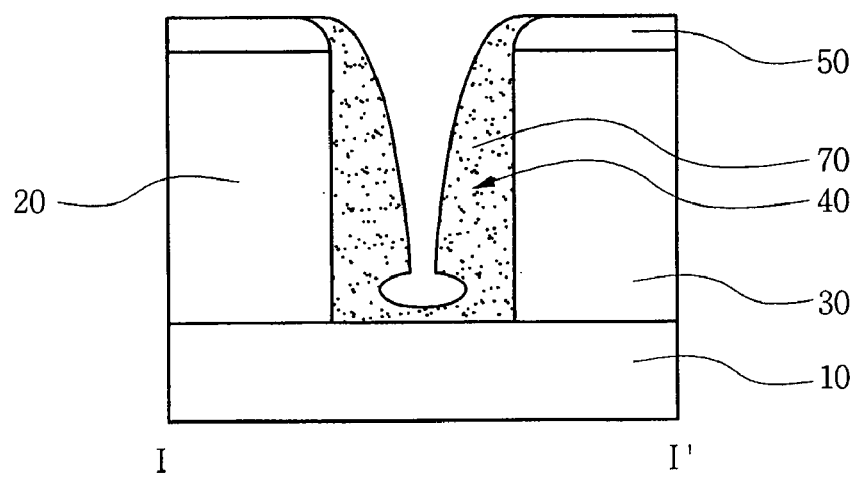

Referring to FIGS. 5B and 6B, the first sacrificial layer 70, is formed to a predetermined thickness on the sidewalls and a bottom of the first trench 40, which is formed between the first word line 20 and the second word line 30. The first sacrificial layer 70 includes a polysilicon layer formed by atomic layer deposition or chemical vapor deposition. For example, the first sacrificial layer 70 may be formed by forming a polysilicon layer to a uniform thickness on an entire surface of the substrate 10 having the first trench 40 and removing the polysilicon layer to be planarized using chemical mechanical polishing in order to expose the first interlayer insulating film 50, leaving the polysilicon layer on the sidewalls and the bottom of the first trench 40. Alternatively, in order to form the first sacrificial layer 70, the polysilicon layer is isotropically removed through a wet etching process or a dry etching process using a photoresist pattern or a second hard mask layer selectively exposing the bottom of the first trench 40 as an etch mask to form the polysilicon layer on the bottom of the first trench 40 in a pool shape. In this case, the first sacrificial layer 70 on the bottom of the first trench 40 may be partially removed through a wet etching process or a dry etching process using a strong acid solution containing a mixture of a sulphuric acid and a nitric acid as an etching solution or using a fluorocarbon gas such as a CxFy gas or a CaHbFc gas as a reactive gas. The fluorocarbon gas may be for example $CF_4$, $CHF_3$, $C_2F_6$, $C_4F_8$, $CH_2F_2$, $CH_3F$, $CH_4$, $C_2H_2$, $C_4F_6$ or a mixture thereof.

Figure 5C:
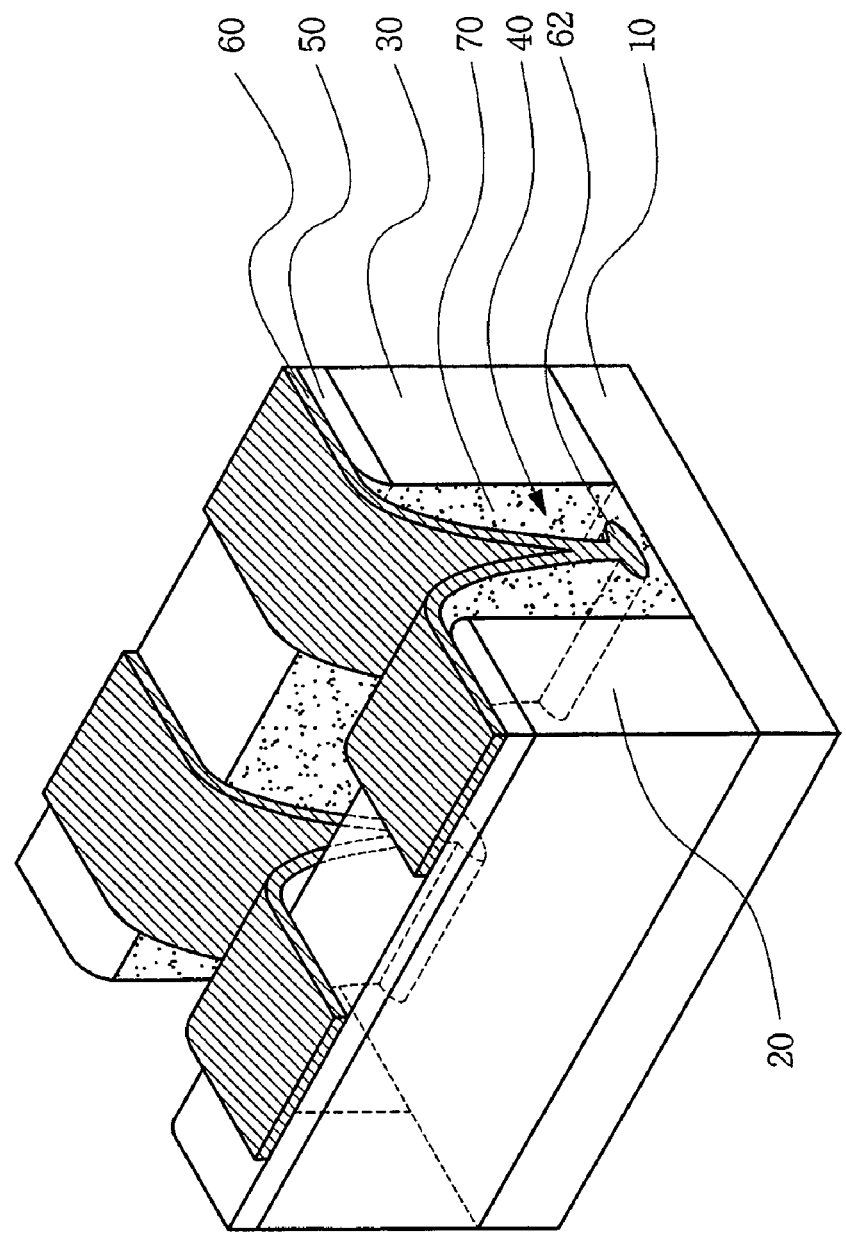
Figure 6C:
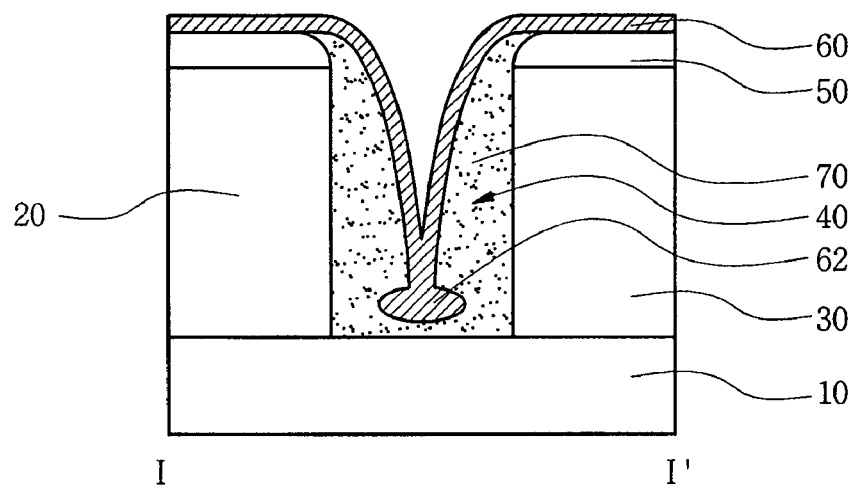

Referring to FIGS. 5C and 6C, the bit line 60 is formed to a predetermined line width on the first interlayer insulating film 50 and the first sacrificial layer 70 to intersect the first and second word lines 20 and 30. Here, the bit line 60 includes, for example, titanium, titanium nitride layer, or carbon nanotube formed by physical vapor deposition, chemical vapor deposition, or electrical discharging method. For example, the bit line 60 may be formed by forming the titanium, the titanium nitride layer, or the carbon nanotube on the entire surface of the substrate 10 having the first sacrificial layer 70 and anisotropically removing the titanium, the titanium nitride layer, or the carbon nanotube using a dry etching process using a photoresist pattern or a second hard mask layer shielding the titanium, the titanium nitride layer, or the carbon nanotube in a direction intersecting the first and second word lines 20 and 30 as an etch mask. The photoresist pattern may be then removed by an ashing process, and the second hard mask layer may be removed at a predetermined etch rate by a reactive gas used upon forming the bit line 60. In this case, the bit line 60 may be formed to be inserted into the first trench 40 along the surface of the first sacrificial layer 70, which is formed on the sidewalls of the first trench 40. The bit line 60 may have a left and right symmetrical structure including a clock-pendulum-shaped or medal-shaped tip 62, having lateral extensions, and having a certain volume located in the groove of the first sacrificial layer 70 adjacent to the bottom of the first trench 40. The portion of the bit line 60 that is present in the trench or gap operates as a transition electrode, during operation, that is either in a rest position between the first and second word lines 20, 30, or is in a position of contact with either of the first or second word lines. Lateral extensions are present on the lobe-shaped tip 62 of the transition electrode portion of the bit line 60 for decreasing the travel distance between the tip 62 and the first or second word lines 20, 30.

Thus, in the method for fabricating a memory device according to the first embodiment of the present invention, the bit line 60 is formed to be inserted into the center of the first trench 40 between the first word line 20 and the second word line 30, and the first and second word lines 20 and 30 are symmetrical to each other with respect to the bit line 60. Thus, it is possible to increase or maximize reliability and production yield.

Figure 5D:
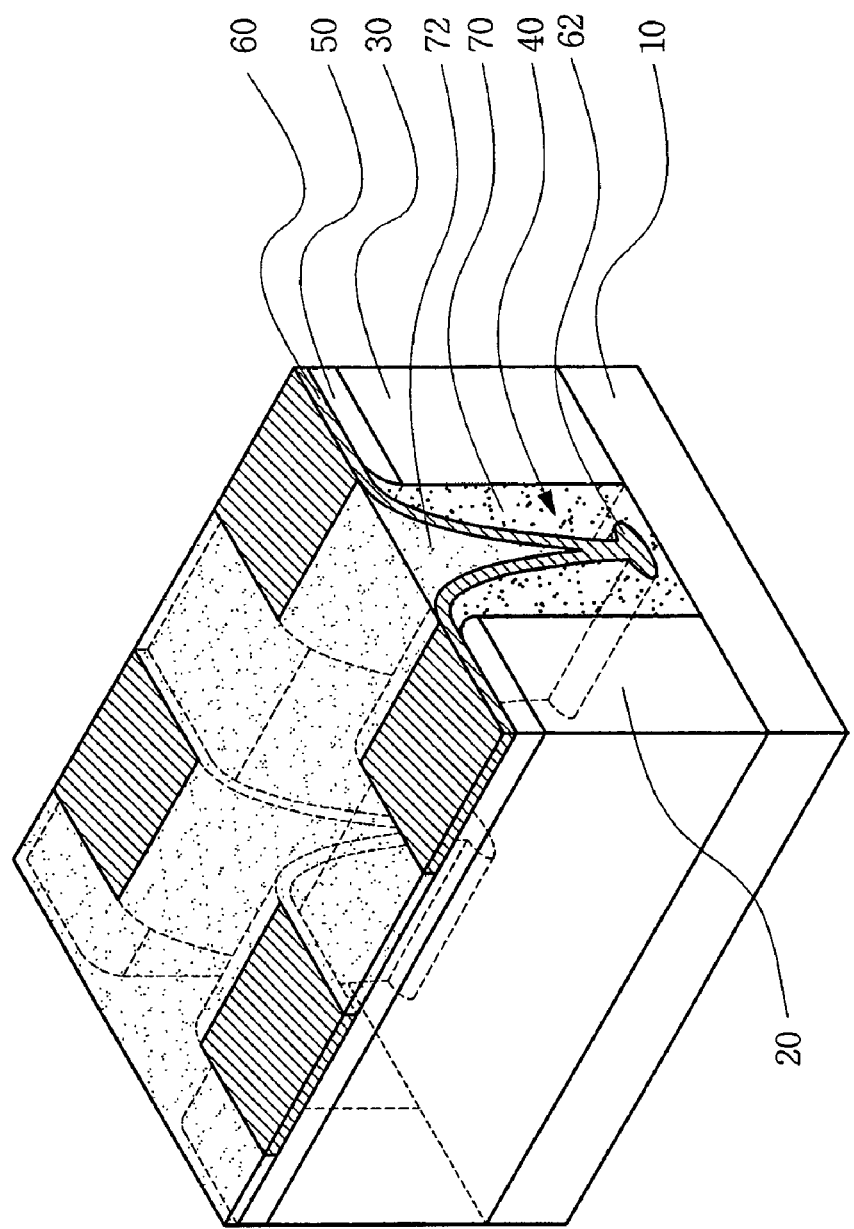
Figure 6D:
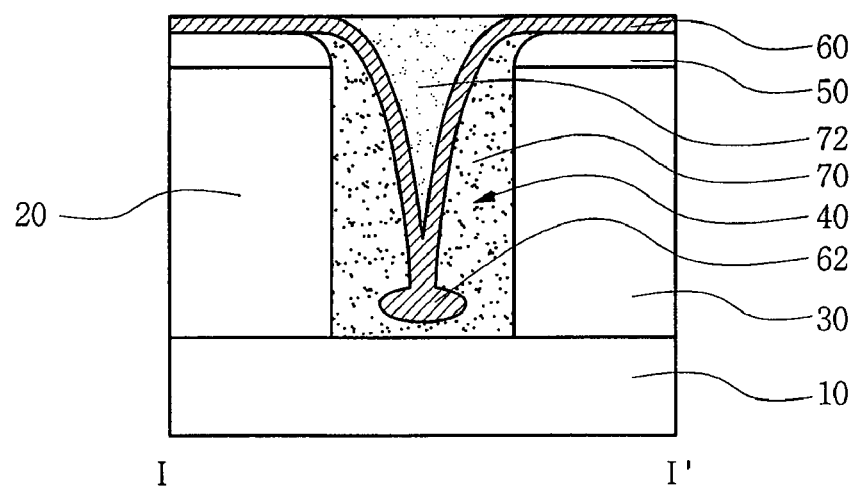

Referring to FIGS. 5D and 6D, the second sacrificial layer 72 is formed which surrounds top and side surfaces of the bit line 60 in the first trench 40 and buries the side surfaces of the bit line 60 over the first interlayer insulating film 50. The second sacrificial layer 72 includes, for example, a polysilicon layer formed by atomic layer deposition or chemical vapor deposition. For example, the second sacrificial layer 72 may be formed in a structure surrounding the top and side surfaces of the bit line 60 in the first trench 40 by forming the polysilicon layer on the entire surface of the substrate to bury the first trench 40 having the bit line 60 and removing the polysilicon layer to be planarized using chemical mechanical polishing to expose the bit line 60.

Figure 5E:
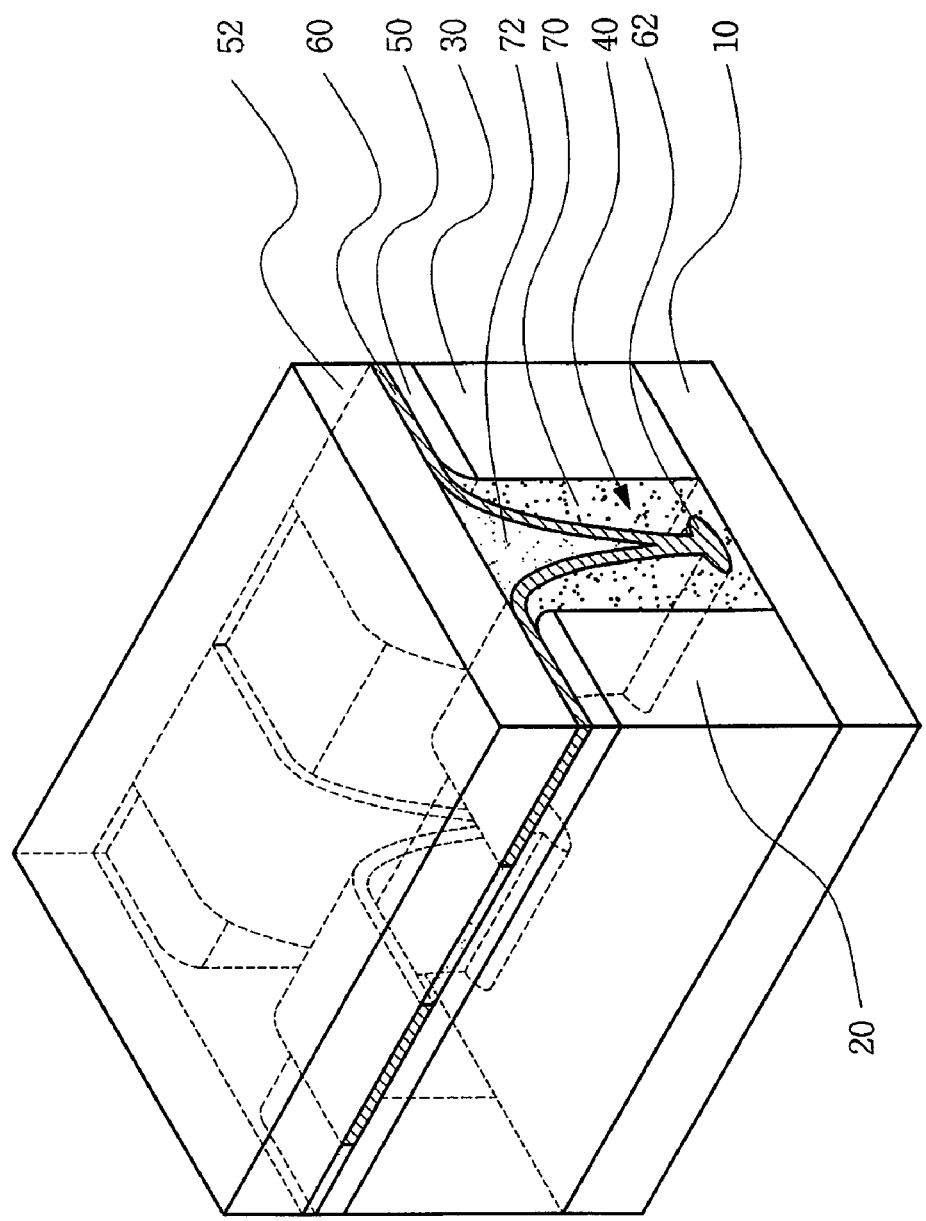
Figure 6E:
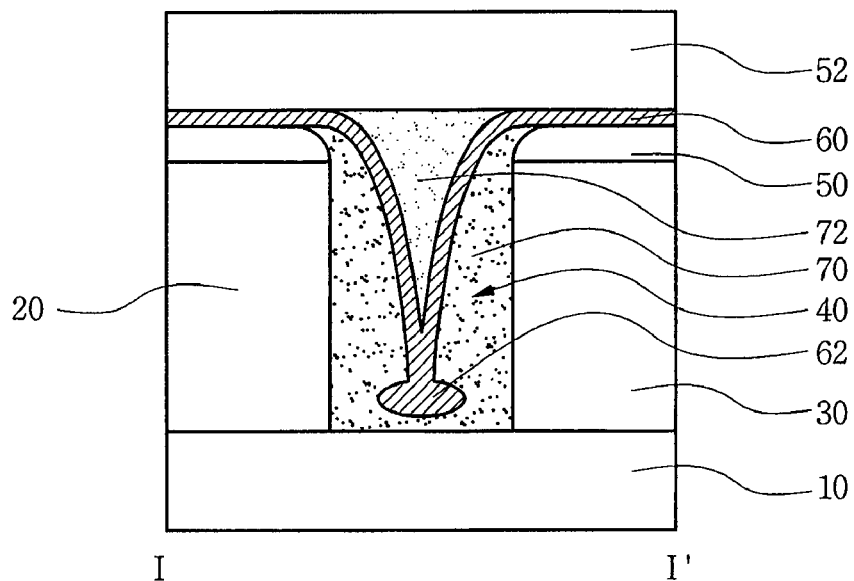

Referring to FIGS. 5E and 6E, the second interlayer insulating film 52 is formed to a predetermined thickness on the entire surface of the substrate 10 having the second sacrificial layer 72. For example, the second interlayer insulating film 52 includes a silicon oxide layer or silicon nitride layer formed to a thickness of about 200 angstroms to about 800 angstroms by chemical vapor deposition. The second interlayer insulating film 52 serves as a roof during fabrication that forms a gap on the bit line 60 when the second sacrificial layer 72 is subsequently removed and that prevents any insulating layer or metal layer formed over the bit line 60 from being grown in the gap.

Figure 5F:
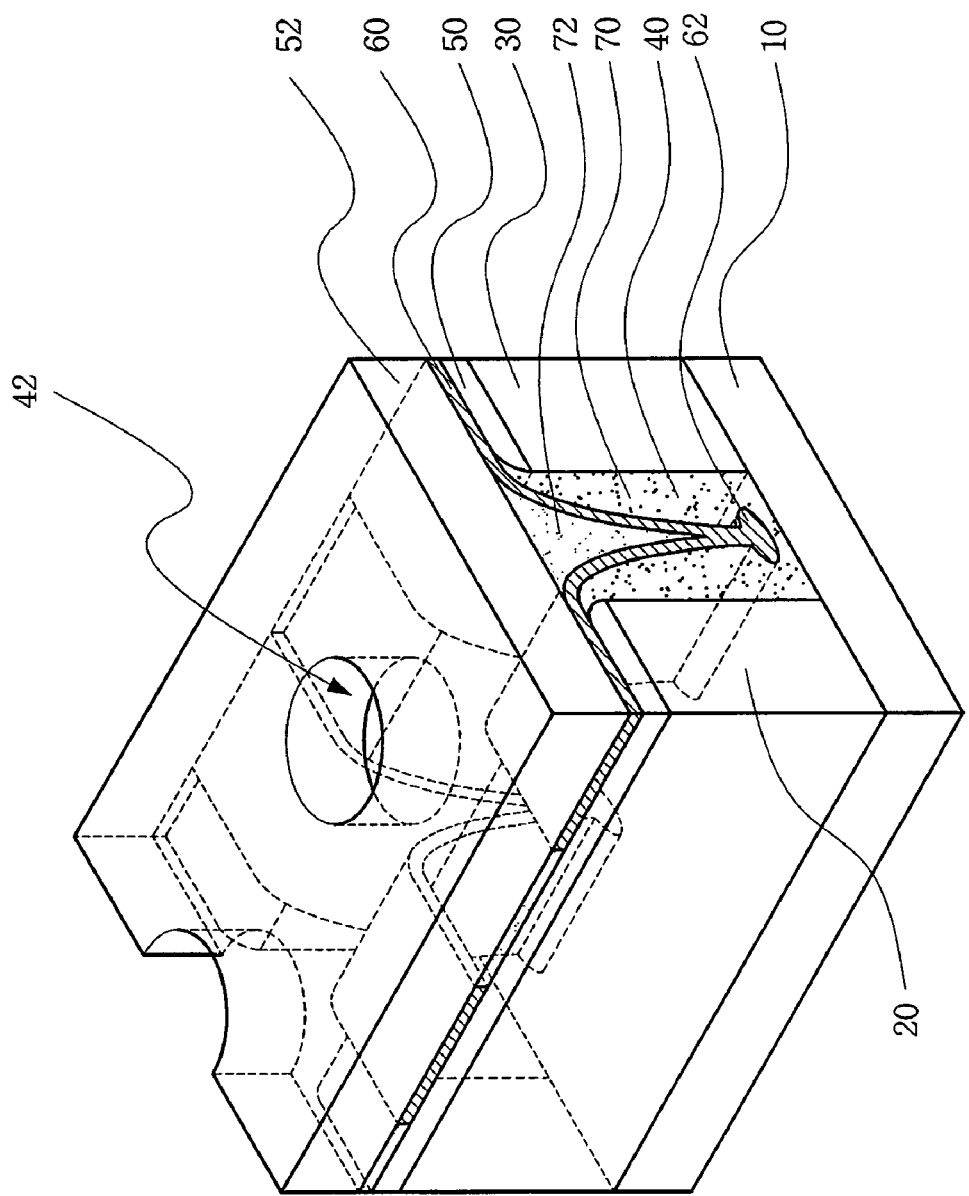
Figure 6F:
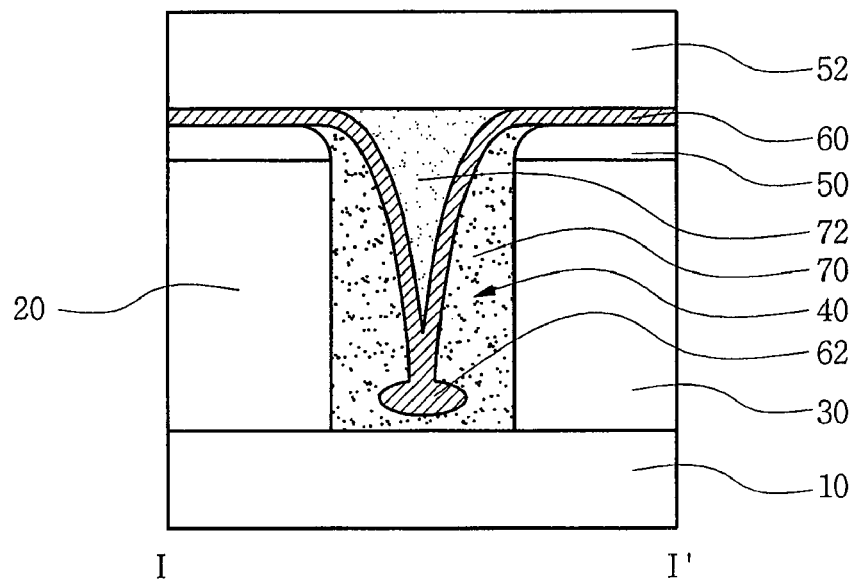

Referring to FIGS. 5F and 6F, the second interlayer insulating film 52 located over the first trench 40 and spaced apart from both edges of the bit line 60 by a certain distance is removed to form the second trench 42. Here, the second trench 42 is an opening that is used to supply an etching solution or a reactive gas under the second interlayer insulating film 52 in order to subsequently remove the first sacrificial layer 70 and/or the second sacrificial layer 72 under the second interlayer insulating film 52. For example, the second trench 42 is formed by removing the second interlayer insulating film 52 at both sides of the bit line 60 using a photoresist pattern shielding the second interlayer insulating film 52 on the bit line 60 as an etch mask to expose the second sacrificial layer 72. In this case, the second trench 42 may be formed to expose the first sacrificial layer 70 or the substrate 10 in the first trench 40.

Figure 5G:
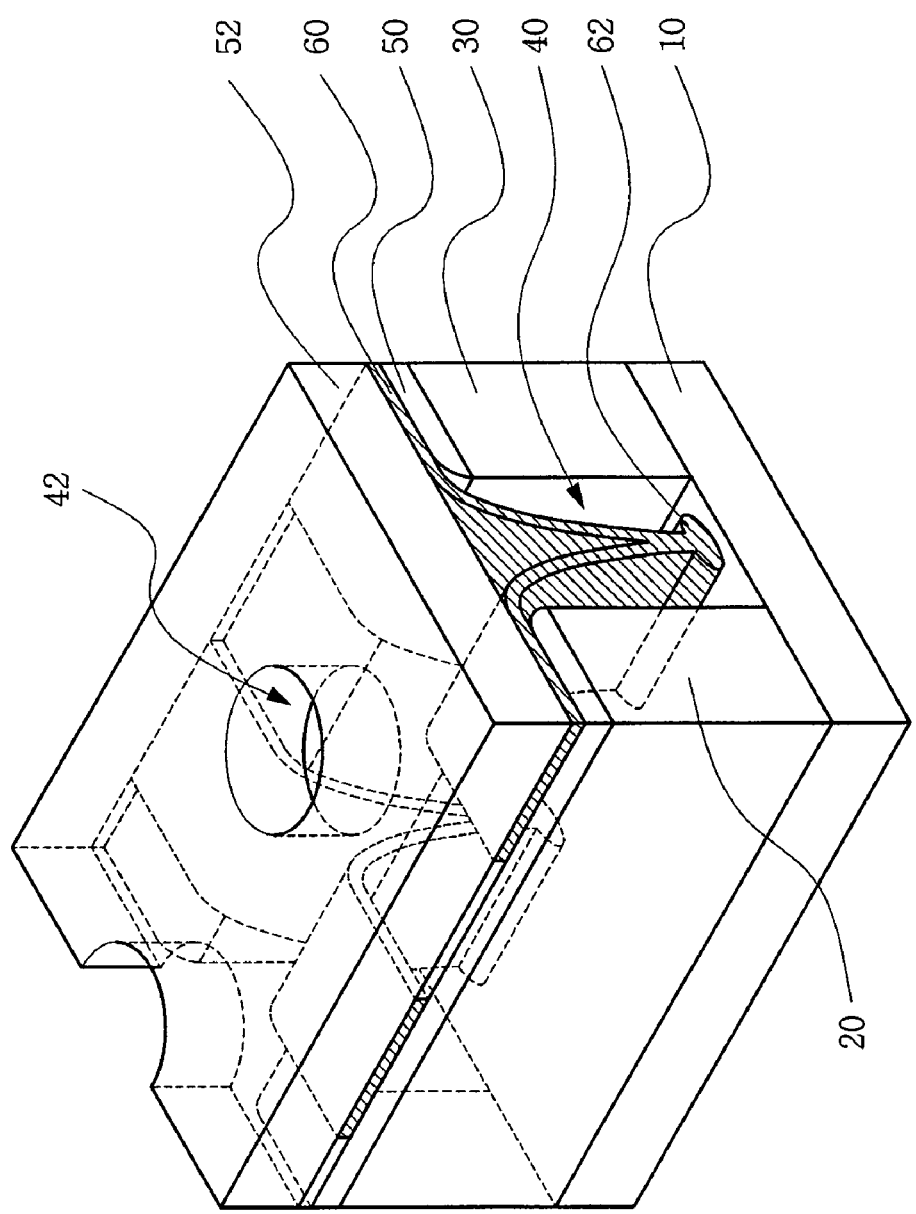
Figure 6G:
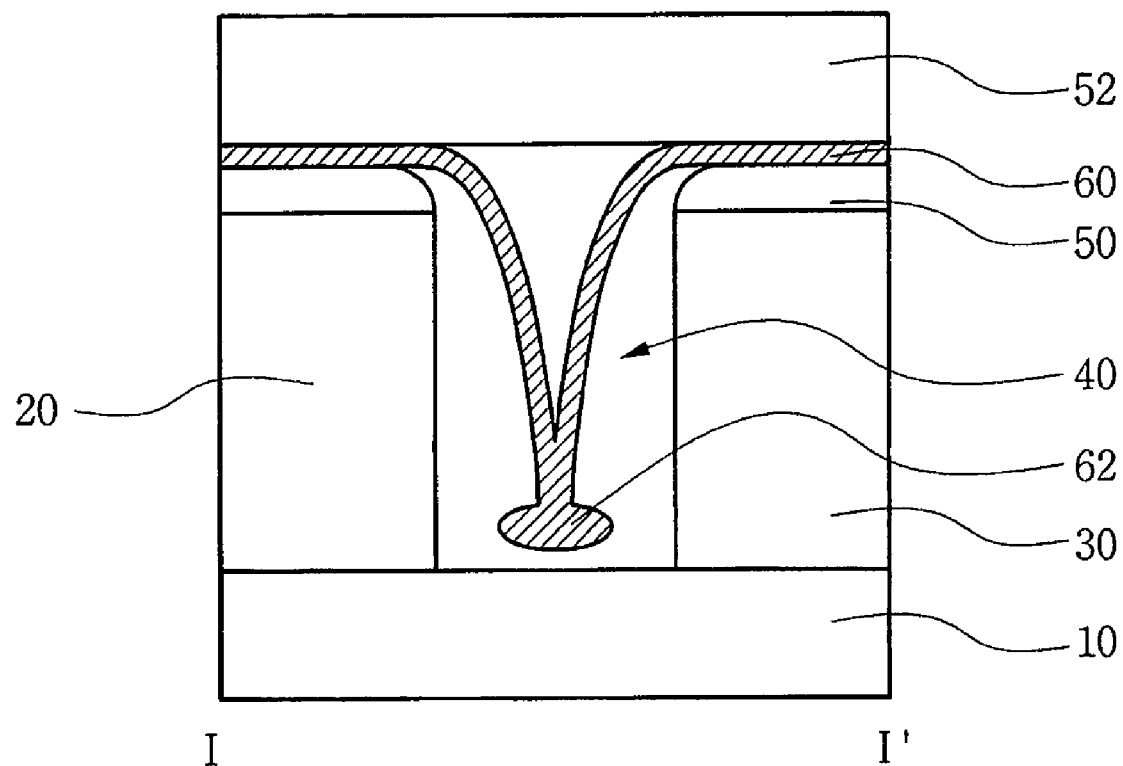

Referring to FIGS. 5G and 6G, the first sacrificial layer 70 and the second sacrificial layer 72 exposed at the sidewalls or bottom of the second trench 42 are isotropically removed to form a gap so that the bit line 60 floats in the first trench 40. Here, the first sacrificial layer 70 and the second sacrificial layer 72 may be isotropically removed through a wet etching process or dry etching process. For example, the first and second sacrificial layers 70 and 72, which are the polysilicon layers, may be isotropically removed by an etching solution including a strong acid solution such as sulphuric acid or nitric acid flowing into the second trench 42 or by a fluorocarbon gas such as CxFy gas or CaHbFc gas as a reactive gas. The fluorocarbon gas may include for example $CF_4$, $CHF_3$, $C_2F_6$, $C_4F_8$, $CH_2F_2$, $CH_3F$, $CH_4$, $C_2H_2$, $C_4F_6$ or a mixture thereof.

Thus, in the method for fabricating a memory device according to the first embodiment of the present invention, the bit line 60 is formed to extend in a first direction of extension, which intersects the first and second word lines 20 and 30 that extend in a second direction of extension and is inserted into the center of the gap corresponding to the first trench 40 formed between the first word line 20 and the second word line 30, resulting in a memory device having a trench 40 and opposed word lines 20, 30 that are symmetrical with respect to the position of the bit line 60. Thus, it is possible to increase or maximize reliability and production yield.

In addition, the tip 62 of the bit line 60 inserted into the center of the gap corresponding to the first trench 40 formed between the first word line 20 and the second word line 30 is formed in a clock-pendulum shape or medal shape, having lateral extensions, so that the bending distance of the bit line 60, or the distance between the rest position and the position in a point of contact with either the first word lines 20 or second word line 30, resulting from the switching operation decreases, and therefore, consumption of power for data writing operations corresponding to the bending distance of the bit line 60 decreases. Thus, it is possible to increase or maximize efficiency of the memory device.

Figure 8:
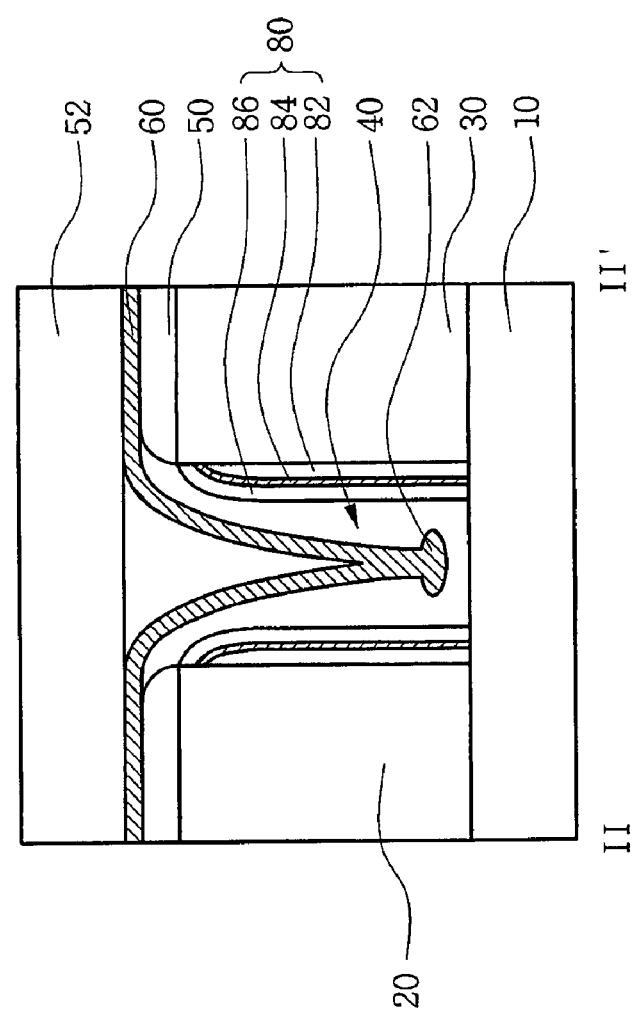
FIG. 8 is a cross-sectional view taken along line II-II' of FIG. 7.

FIG. 7 is a perspective view illustrating a memory device according to a second embodiment of the present invention, and FIG. 8 is a cross-sectional view taken along line II-II' of FIG. 7. Here, the same reference numerals as those in the first embodiment are used to refer to elements that are the same as those in the first embodiment.

Referring to FIGS. 9A to 9I and 7, a memory device according to the second embodiment of the present invention includes a substrate 10 having a substantially flat upper surface; first and second word lines 20 and 30 formed at a certain interval and in parallel with each other on the substrate 10; a first trench 40 formed between the first word line 20 and the second word line 30 and exposing the substrate 10; a first interlayer insulating film 50 formed on the first and second word lines 20 and 30 excluding the first trench 40; a bit line 60 inserted into the first trench 40 and intersecting the first and second word lines 20 and 30 on the first interlayer insulating film 50, spaced apart from the first and second word lines 20 and 30 by a predetermined distance in the first trench 40, and capable of being bent toward either the first word line 20 or the second word line 30 in the first trench 40 due to an electrical signal applied to the first and second word lines 20 and 30; and a charge trapping structure 80 formed on the sidewalls of the first and second word lines 20 and 30 adjacent to the bit line 60 to be insulated and trapping charge applied by the first and second word lines 20 and 30 in order to electrostatically fix the bit line 60 in a bent position toward the first word line 20 or the second word line 30.

The memory device further includes a second interlayer insulating film 52 formed on an entire surface of the substrate 10 having the bit line 60 to have a gap with the bit line 60 on the first trench 40, and a second trench 42 formed by removing the second interlayer insulating film 52 on the first trench 40 adjacent to both edges of the bit line 60 in order to expose the substrate 10.

The substrate 10 has a substantially flat upper surface and the first and second word lines 20 and 30 are formed in parallel with each other on the substrate 10 and extend in one direction. For example, the substrate 10 can include an insulating substrate or a semiconductor substrate having excellent flexibility so that it is bent by an external force.

The first and second word lines 20 and 30 are formed to a predetermined thickness and in parallel with each other on the substrate 10. The first and second word lines 20 and 30 are formed of a material having superior electrical conductivity. For example, the first and second word lines 20 and 30 may be formed of a conductive metal material having excellent conductivity, such as gold, silver, copper, aluminum, tungsten, tungsten silicide, titanium, titanium nitride, tantalum, or tantalum silicide.

The first and second word lines 20 and 30 may be patterned to have a predetermined line width using the first overlying interlayer insulating film 50 as an etch mask. Alternatively, the first and second word lines 20 and 30 may be patterned using a first hard mask layer (not shown) stacked on the first interlayer insulating film 50 as an etch mask. The first interlayer insulating film 50 may be formed as a separate layer beneath the first hard mask layer or as the first hard mask layer. For example, when the first interlayer insulating film 50 is formed as the first hard mask layer, it may include a silicon nitride layer. Alternatively, when the first interlayer insulating film 50 may be formed as a separate layer beneath the first hard mask layer, it may include a silicon oxide layer formed beneath the first hard mask layer as a silicon nitride layer. Accordingly, the first interlayer insulating film 50 is located on the first and second word lines 20 and 30 and used as an etch mask for patterning the first trench 40. The first interlayer insulating film 50 insulates the first and second word lines 20 and 30 and the bit line 60.

The charge trapping structure 80 is formed to a predetermined thickness on the sidewalls of the first trench 40 at the exposed sidewalls of the first and second word lines 20 and 30, and the bit line 60 is inserted to predetermined depth between the first word line 20 and the second word line 30. For example, the distance between the charge trapping structures 80 formed on both sidewalls of the first trench 40 defines the traveling distance of the bit line 60 between the two word lines 20, 30. In addition, the depth of the first trench 40 corresponds to a thickness of the first and second word lines 20 and 30 and the first interlayer insulating film 50 and may limit the length of the bit line 60, which is inserted between the first word line 20 and the second word line 30.

Accordingly, as the width of the first trench 40 decrease, or as the thicknesses of the charge trapping structures 80 formed on the sidewalls of the first trench 40 increase, the bending distance of the bit line 60 decreases and integration of the memory device increases. Furthermore, as the thickness of the first and second word lines 20 and 30 or the height of the first interlayer insulating film 50 on the first and second word lines 20 and 30 increases, the integration of the memory device can increase.

The bit line 60 is located on the first interlayer insulating film 50 and formed to be flat while intersecting the first and second word lines 20 and 30. The bit line 60 is supported by the first interlayer insulating film 50 located on the first and second word lines 20 and 30 and floats in the first trench 40 and to a predetermined height from the substrate 10. For example, the bit line 60 is supported by the first interlayer insulating film 50 at both upper ends of the first trench 40 and inserted into the first trench 40. The bit line 60 has a clock-pendulum-shaped or medal-shaped tip 62, having lateral extensions, and is suspended above the bottom of the first trench 40 by a predetermined height. In this case, the tip 62 of the bit line 60 may correspond to a contact point brought into electrical contact with sidewalls of the first and second word lines 20 and 30, which are exposed to the inner walls of the first trench 40.

Although not shown in FIG. 7, the memory device according to the second embodiment of the present invention further is formed using a first sacrificial layer (70 of FIG. 9D) formed to a predetermined thickness on the bottom of the first trench 40 and the sidewalls of the charge trapping structure 80 in the first trench 40 and used as a mold for the bit line 60 in the first trench 40; and using a second sacrificial layer (72 of FIG. 9F) stacked on the first sacrificial layer 70 formed in the first trench 40 and the bit line 60, and removed together with the first sacrificial layer 70 by an etching solution or an etching gas supplied through the second trench 42, which is formed on both edges of the bit line 60.

The bit line 60 is formed of a conductor having a predetermined elasticity to freely move in a horizontal direction due to an electrical field induced in the gap corresponding to the first trench 40 formed between the bit line 60 and the first or second word line 20 or 30. For example, the bit line 60 can be formed of a titanium, titanium nitride, or carbon nanotube material.

The charge trapping structure 80 is formed to be brought into contact with the first and second word lines 20 and 30 on the sidewalls of the first trench 40. The charge trapping structure 80 tunnels and traps charge applied through the first and second word lines 20 and 30. Even when the active application of charge is removed from the first and second word lines 20 and 30, the charge trapped in the charge trapping structure 80 can be confined (bound) to the structure 80 at all times. For example, the charge trapping structure 80 includes a thin film having an oxide-nitride-oxide (ONO) structure in which a first silicon oxide layer 82, a silicon nitride layer 84, and a second silicon oxide layer 86 are sequentially stacked at the sidewall of the first word line 20 or the second word line 30. The charge trapping structure 80 can further optionally include a thin film having a structure in which the first silicon oxide layer 82, a polysilicon layer, and the second silicon oxide layer 86 are stacked. The polysilicon layer is doped with conductive impurities to have conductivity. In the example shown, the charge trapping structure 80 protrudes in an arced shape from the sidewalls of the first trench 40 or in a rod shape that is in parallel with the first and second word lines 20 and 30 from the sidewalls of the first trench 40.

Accordingly, when current having a predetermined magnitude and direction is applied to the first and second word lines 20 and 30, the charge tunneling through the first silicon oxide layer 82 may be trapped in the silicon nitride layer 84 or polysilicon layer of the charge trapping structure 80. Thereafter, when charge having the same polarity as that of the charge applied to the charge trapping structure 80 are selectively applied to the first word line 20 and charge having an opposite polarity to the charge applied to the first word line 20 are supplied to the bit line 60, the bit line 60 moves in a direction toward the first word line 20.

On the other hand, when charge having the same polarity as that of the charge applied to the charge trapping structure 80 is selectively applied to the second word line 30 and charge having an opposite polarity to the charge applied to the second word line 30 is supplied to the bit line 60, the bit line 60 moves in a direction toward the second word line 30. A traveling direction of the bit line 60 may be represented by the Coulomb's force F.

When charge having a different polarity and exceeding a predetermined amount is applied to the first word line 20 and the charge trapping structure 80 formed on the sidewall of the first word line 20 and to the bit line 60, the bit line 60 is bent toward the first word line 20 due to an attractive force between the first word line 20 and the bit line 60 and brought into contact with the charge trapping structure 80 formed on the sidewall of the first word line 20. In this case, charge having the same polarity and exceeding a predetermined amount may be applied to the second word line 30 and the charge trapping structure 80 adjacent to the second word line 30 and to the bit line 60 so that a repulsive force is exerted between the bit line 60 and the second word line 30, which assists in bending the bit line 60 toward the first word line 20.

On the other hand, when charge having a different polarity and exceeding a predetermined amount is applied to the second word line 30 and the charge trapping structure 80 formed on the sidewall of the second word line 30 and to the bit line 60, the bit line 60 is bent toward the second word line 30 and brought into contact with the charge trapping structure 80 formed on the sidewall of the second word line 30 due to an attractive force exerted between the second word line 30 and the bit line 60. In this case, charge having the same polarity and exceeding a predetermined amount may be applied to the first word line 20 and the charge trapping structure 80 adjacent to the first word line 20 and to the bit line 60 so that a repulsive force is exerted between the bit line 60 and the first word line 20, which can accelerate bending of the bit line 60 toward the second word line 30.

Thus, the memory device according to the second embodiment of the present invention can store one-bit information corresponding to a state where the bit line 60 inserted into the first trench 40 formed between the first and second word lines 20 and 30 is in contact with the charge trapping structure 80 adjacent to the first word line 20 on the sidewall of the first trench 40, and a state where the charge trapping structure 80 adjacent to the second word line 30 on the sidewall of the first trench 40 is in contact with the bit line 60.

Further, when the bit line 60 begins to be bent in a direction toward the first word line 20 or the second word line 30, any one of the charge trapping structures 80 adjacent to the first word line 20 or the second word line 30 becomes closer to the bit line 60. Consequently, a Coulomb's force, as an attractive force, is increased. The Coulomb's force increases in inverse proportion to the square of the distance between the charge trapping structure 80 and the bit line 60. Even in the event where charge is not being actively applied to the bit line 60, the bit line 60 remains bent in a direction toward one of the first and second word lines 20, 30 by the charge trapped in the charge trapping structure 80. This is because charge having an opposite polarity to the charge trapped in the charge trapping structure 80 is bound or charged in the bit line 60 due to an electrical field induced by the charge trapped in the charge trapping structure 80. In addition, even though charge having an opposite polarity to the charge trapped in the charge trapping structure 80 and exceeding a predetermined amount is supplied to the bit line 60, power is not consumed since the charge trapping structure 80 is not electrically connected to the bit line 60, and the bit line 60 retained in a bent position toward the charge trapping structure 80. In this case, because an electrostatic force represented by the Coulomb's force is at least several-to-ten-thousand times stronger than a normal elastic force or restoring force of the bit line material, an electrostatic connection between the charge trapping structure 80 and the bit line 60 is not readily easily broken by the elastic force or restoring force. Indeed, in implementing a nano-scale microstructure device, the Coulomb's force is proportional to the reciprocal of the square of the distance while the elastic force or restoring force is simply proportional to the distance. Accordingly, the bit line 60 having a microstructure may move toward the first word line 20 or the second word line 30 due to the Coulomb's force in opposition to the restoring force and be brought into contact with the charge trapping structure 80 formed on the sidewall of the first word line 20 or the second word line 30. After the charge trapping structure 80 is brought into contact with the bit line 60, the bending state of the bit line 60 may be sustained due to the Coulomb's force.

In this manner, the memory device according to the second embodiment of the present invention includes the charge trapping structure 80 trapping charge applied by the first and second word lines 20 and 30 so that the bit line 60 having the clock-pendulum-shaped or medal-shaped tip 62, having lateral extensions, which is inserted into the first trench 40 formed between the first and second word lines 20 and 30 and bent toward the first word line 20 or the second word line 30 is electrostatically fixed, thereby reducing consumption of standby power required for storing information and preventing information loss, even in the event that charge is not actively supplied through the first and second word lines 20 and 30. Thus, it is possible to implement a nonvolatile memory device.

In the first trench 40, when the bit line 60 is in contact with any one of the plurality of charge trapping structures 80 adjacent to the first and second word lines 20 and 30, one-bit information corresponding to '0' or '1' can be read by comparing an electrical field or voltage induced between the first word line 20 and the bit line 60 to an electrical field or voltage induced between the second word line 30 and the bit line 60.

For example, a first electrical field or a first voltage induced between the first word line 20 and the bit line 60 when the charge trapping structure 80 adjacent to the first word line 20 is in contact with the bit line 60 is greater than a second electrical field or a second voltage induced between the second word line 30 and the bit line 60. This is because the distance between the first word line 20 and the bit line 60 is smaller than the distance between the second word line 30 and the bit line 60. In the memory device according to the second embodiment of the present invention, the information corresponding to '0' can be read when the first electrical field or the first voltage is greater than the second electrical field or the second voltage.

On the other hand, the second electrical field or the second voltage induced between the second word line 30 and the bit line 60 is greater than the first electrical field or the first voltage induced between the first word line 20 and the bit line 60 when the charge trapping structure 80 adjacent to the second word line 30 is in contact with the bit line 60. Similarly, in the memory device according to the second embodiment of the present invention, the information corresponding to '1' can be read when the second electrical field or the second voltage is greater than the first electrical field or the first voltage.

Meanwhile, during fabrication, the bit line 60 is covered with the second interlayer insulating film 52 formed on the bit line 60 and the second sacrificial layer 72 to define the shape of the bit line 60 so that the bit line 60 has flexibility inside the first trench 40. This is because a gap is formed between the bit line 60 and the second interlayer insulating film 52 as the second sacrificial layer 72 formed in or on the first trench 40 is removed.

In this case, the second trench 42 is formed to expose to the sidewalls thereof the second sacrificial layer 72 formed between the second interlayer insulating film 52 and the bit line 60 and allows inflow of the etching solution or etching gas for removing the second sacrificial layer 72 and the first sacrificial layer 70 in order to form the gap between the bit line 60 and the second interlayer insulating film 52.

Thus, in the memory device according to the second embodiment of the present invention, the clock-pendulum-shaped or medal-shaped tip 62 of the bit line 60, having lateral extensions, is inserted into the gap formed between the plurality of charge trapping structures 80, which are formed on the sidewalls of the first trench 40 between the first and second word lines 20 and 30 formed in parallel with each other, such that the first and second word lines 20 and 30 are symmetrical to each other with respect to the bit line 60.

A method for fabricating the memory device according to the second embodiment of the present invention will now be described.

FIGS. 9A to 9I And 10A to 10I are perspective views and cross-sectional views illustrating a method for fabricating the memory device of FIGS. 7 and 8. In FIG. 10A to 10I, the cross-sectional views taken from FIG. 9A to 9I are sequentially illustrated.

Figure 9A:
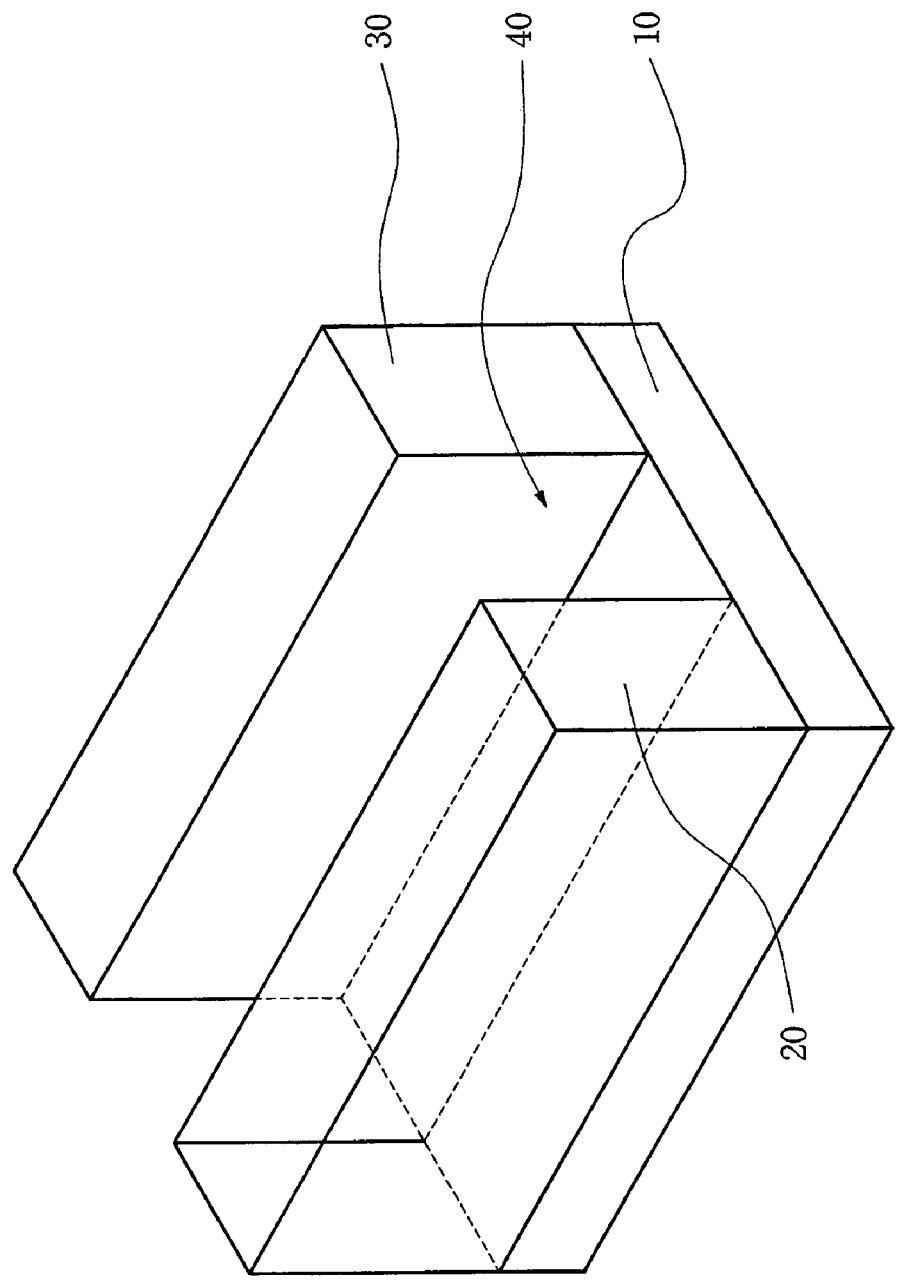
FIGS. 9A to 9I and 10A to 10I are perspective views and cross-sectional views respectively illustrating a method for fabricating the memory device of FIGS. 7 and 8.
Figure 10A:
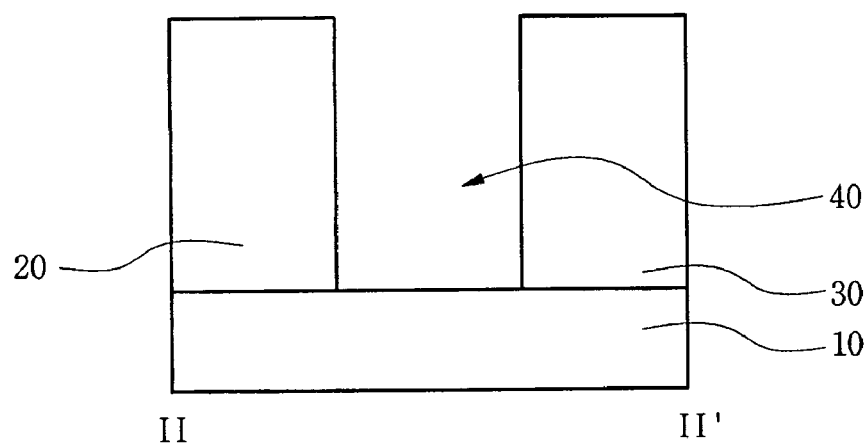

Referring to FIGS. 9A and 10A, the first and second word lines 20 and 30 are formed to a predetermined thickness and in parallel with each other on the substrate 10 having the substantially flat upper surface. The first and second word lines 20 and 30 are formed to a predetermined height and spaced apart from each other by a predetermined distance on the substrate 10. The first trench 40 having a bottom is formed which exposes the substrate 10 between the first word line 20 and the second word line 30. For example, the first and second word lines 20 and 30 may be formed by forming a conductive metal layer on the substrate 10 through physical vapor deposition or chemical vapor deposition and anisotropically removing the conductive metal layer to a predetermined line width through a dry etching process using a photoresist pattern or a first hard mask layer shielding the conductive metal layer as an etch mask layer. In this case, a reactive gas used in the dry etching process contains a strong acid gas including a mixture of a sulphuric acid and a nitric acid. Furthermore, the first and second word lines 20 and 30 are formed to a thickness of about 500 Å to about 1500 Å and a line width of about 30 Å to about 500 Å, and the first, trench 40 having a width of about 100 Å to about 500 Å is formed between the first word line 20 and the second word line 30.

Figure 9B:
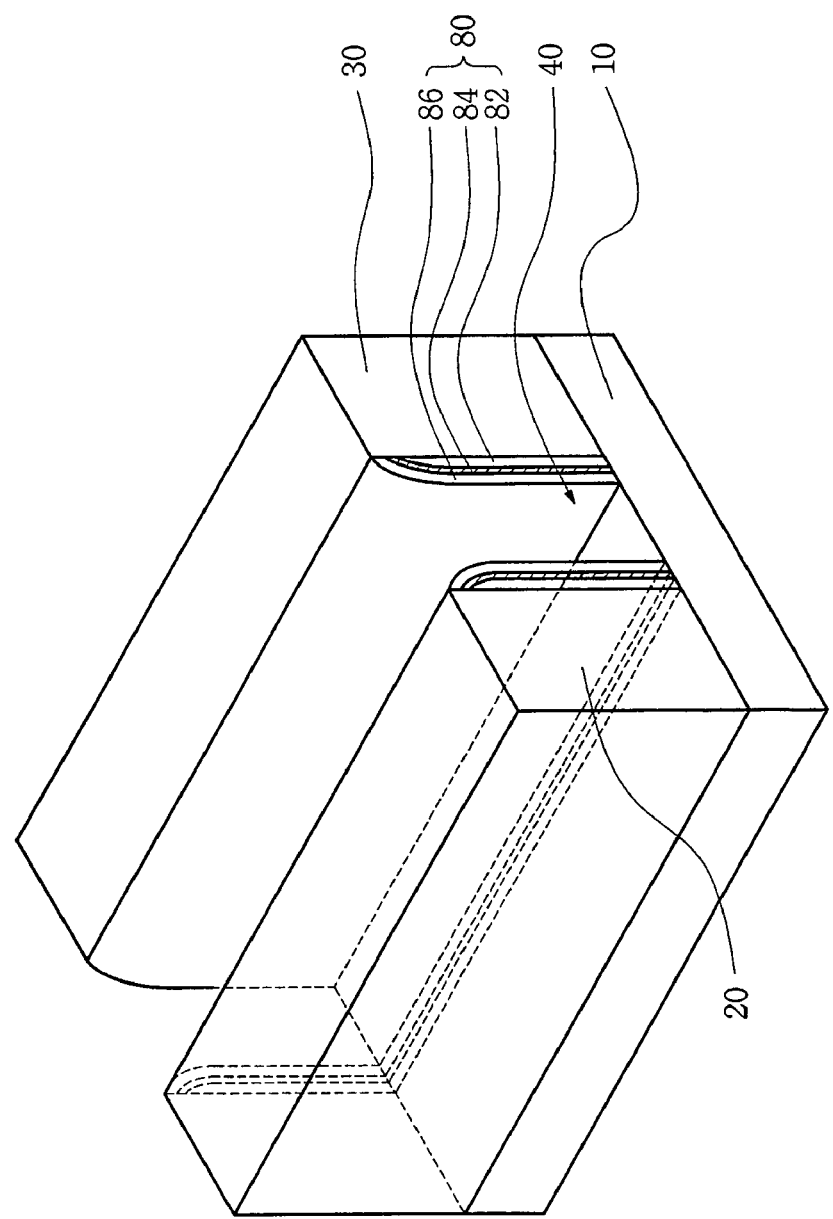
Figure 10B:
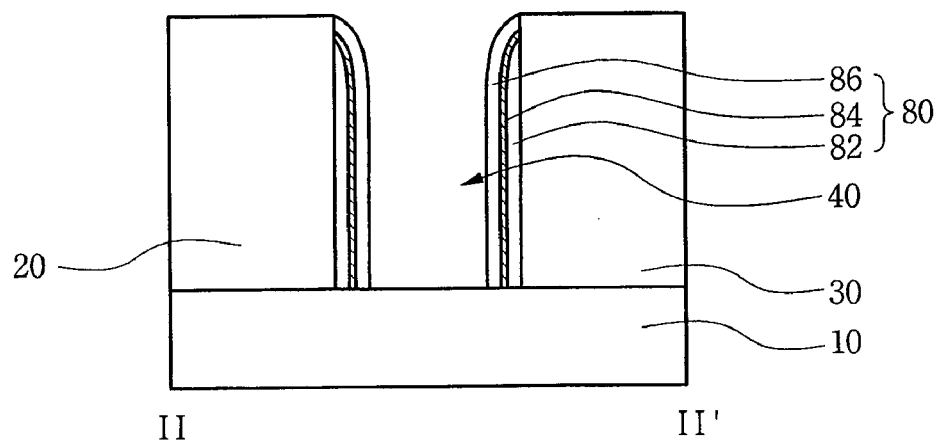

Referring to FIGS. 9B and 10B, the charge trapping structures 80 are formed to a predetermined thickness to be protruded on the sidewalls of the first trench 40, which is formed between the first word line 20 and the second word line 30.

The charge trapping structure 80 includes a first silicon oxide layer 82, a silicon nitride layer 84 or polysilicon layer, and a second silicon oxide layer 86, which are formed by atomic layer deposition or chemical vapor deposition. In this case, the charge trapping structure 80 may be formed to be protruded in a fan shape from the sidewalls of the first trench 40 using a dry etching process with self alignment having an excellent anisotropic vertical etching characteristic. For example, the first silicon oxide layer 82 is formed to a predetermined thickness on the entire surface of the substrate 10 having the first trench 40 and removed through the dry etching process to expose the bottom of the first trench 40, leaving the first silicon oxide layer 82 on the sidewalls of the first trench 40. Further, the silicon nitride layer 84 or polysilicon layer is formed on the entire surface of the substrate 10 and is removed through the dry etching process, leaving the silicon nitride layer 84 or polysilicon layer on the first silicon oxide layer 82 on the sidewall of the first trench 40. Similarly, the second silicon oxide layer 86 is selectively formed on the silicon nitride layer 84 or polysilicon layer formed on the sidewall of the first trench 40, resulting in the circular arc-shaped charge trapping structure 80 including the first silicon oxide layer 82, the silicon nitride layer 84 or polysilicon layer, and the second silicon oxide layer 86 in the direction protruding from the sidewall of the first trench 40. Alternatively, the first silicon oxide layer 82, the silicon nitride layer 84 or polysilicon layer, and the second silicon oxide layer 86 may be sequentially formed to a uniform thickness in the first trench 40 and removed and planarized in order to expose the first and second word lines 20 and 30, resulting in the vertical charge trapping structure on the substrate 10 in the first trench 40.

Figure 9C:
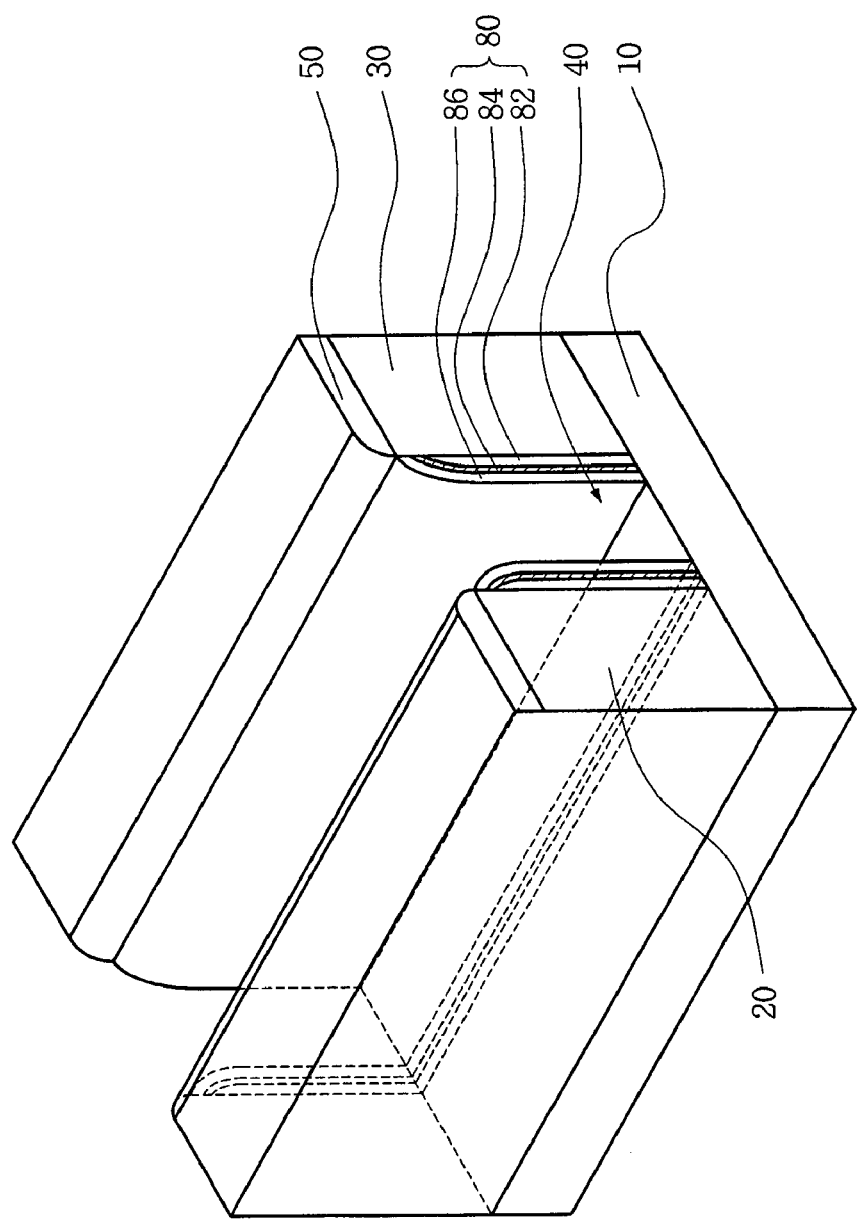
Figure 10C:
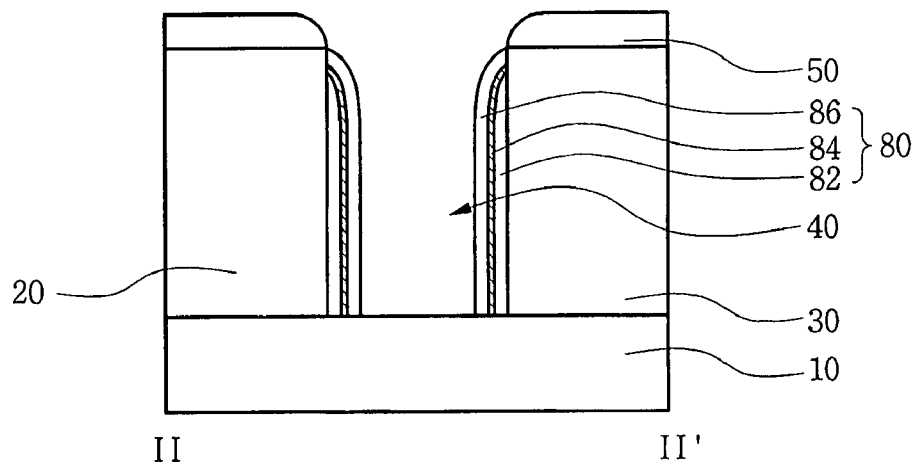

Referring to FIGS. 9C and 10C, the first interlayer insulating film 50 is formed to a predetermined thickness on the first and second word lines 20 and 30 having the charge trapping structure 80. The first interlayer insulating film 50 includes a silicon oxide layer or silicon nitride layer formed by chemical vapor deposition. The first interlayer insulating film 50 is divided into two portions each located on the first and second word lines 20 and 30. For example, the first interlayer insulating film 50 may be formed by forming a silicon oxide layer or silicon nitride layer on the entire surface of the substrate 10 using chemical vapor deposition such as TEOS, USG, SOG, or HDP-CVD and anisotropically removing the silicon oxide layer and the conductive metal layer through a dry etching process using a photoresist pattern shielding the silicon oxide layer or silicon nitride layer on the first and second word lines 20 and 30 as an etch mask layer. In this case, when the first interlayer insulating film 50 includes the silicon oxide layer, it is removed with a predetermined selectivity with respect to the second silicon oxide layer 86 of the charge trapping structure 80. For example, the second silicon oxide layer 86 of the charge trapping structure 80 includes high-density silicon oxide layer formed by high HDP-CVD having high etching selectivity through a dry etching process and the first interlayer insulating film 50 includes a low-density silicon oxide layer formed by TEOS.

Alternatively, the first interlayer insulating film 50 may be formed on the first and second word lines 20 and 30 before the charge trapping structure 80 is applied. However, the bit line 60 formed on the first interlayer insulating film 50 may be brought into contact with the charge trapping structure 80 at both ends of the first trench 40 and charge trapped in the silicon nitride layer 84 or polysilicon layer of the charge trapping structure 80 may be tunneled to the bit line 60. Accordingly, the second silicon oxide layer 86 should be formed to a predetermined thickness or more in order to prevent the charge trapped in the charge trapping structure 80 from being tunneled to the bit line 60. For example, for the structure in which the first interlayer insulating film 50 is formed and then the charge trapping structure 80 is formed, a conductive metal layer and a silicon oxide layer or silicon nitride layer are stacked on the entire surface of the substrate 10 and are removed through a dry etching process using a photoresist pattern having a predetermined line width as an etch mask in order to form the first and second word lines 20 and 30, and the first interlayer insulating film 50 on the first and second word lines 20 and 30. Then, on the first interlayer insulating film 50, the first silicon oxide layer 82, the silicon nitride layer 84 or polysilicon layer, and the second silicon oxide layer 86 are sequentially formed on the sidewalls of the first trench 40 between the first and second word lines 20 and 30 through a dry etching process with self alignment. Here, in the case where the first interlayer insulating film 50 includes the silicon oxide layer, the first interlayer insulating film 50 includes a high-density silicon oxide layer formed by HDP-CVD having a high etching selectivity among the dry etching processes, and the first silicon oxide layer 82 and the second silicon oxide layer 86 include a low-density silicon oxide layer formed by TEOS.

Figure 9D:
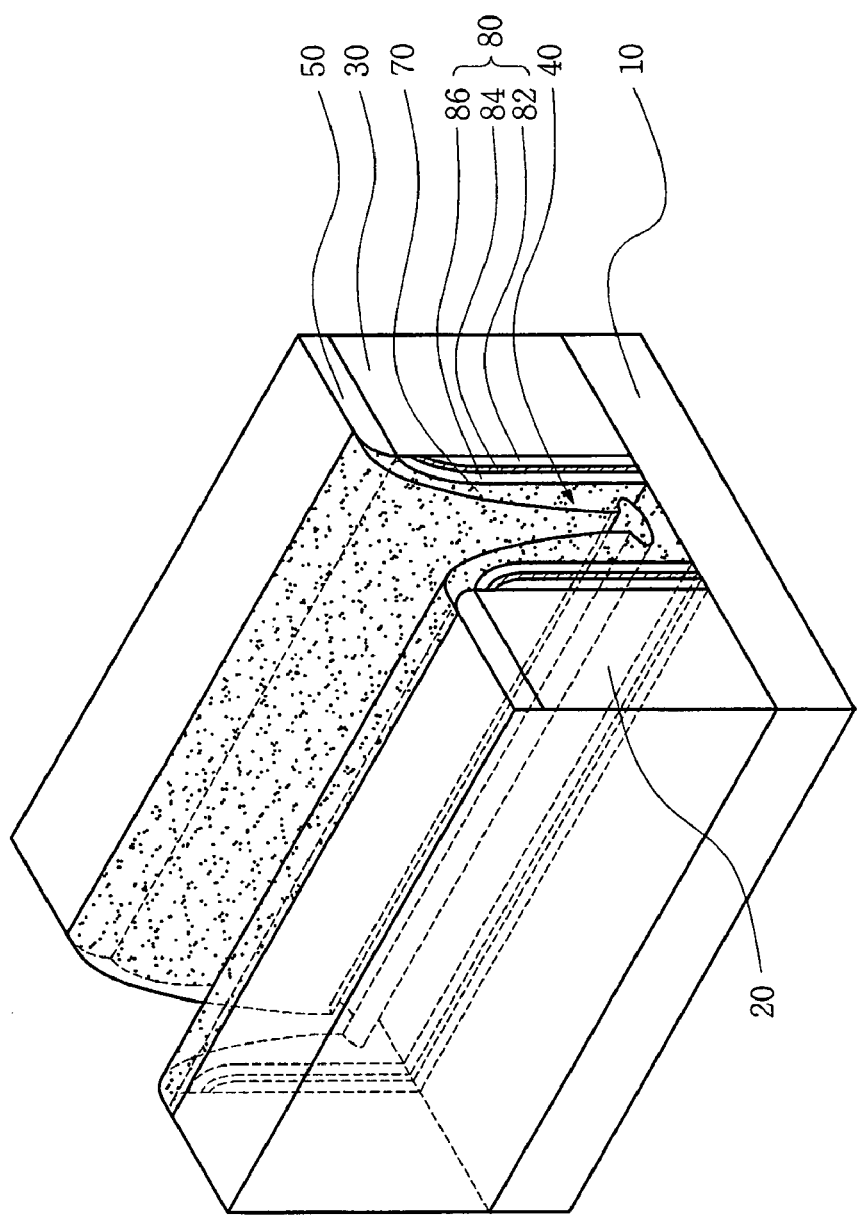
Figure 10D:
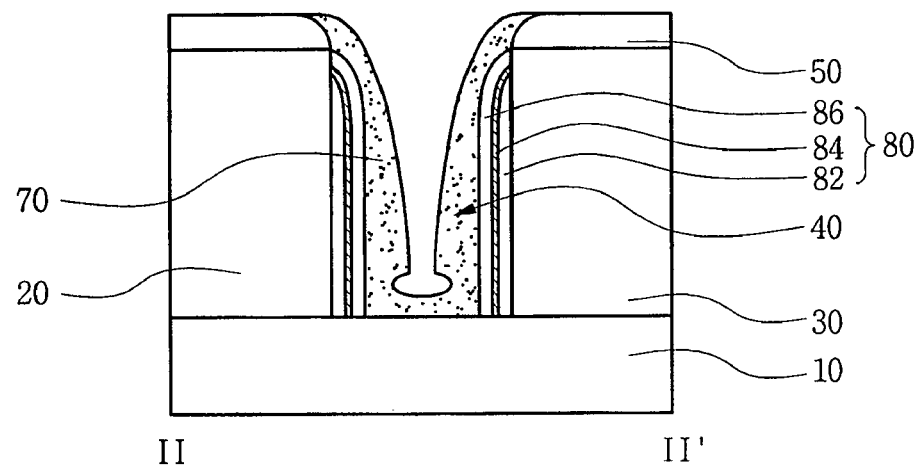

Referring to FIGS. 9D and 10D, the first sacrificial layer 70 is formed to a predetermined thickness on the sidewalls of the charge trapping structure 80 formed in the first trench 40 and the bottom of the first trench 40. The first sacrificial layer 70 includes a polysilicon layer formed by atomic layer deposition or chemical vapor deposition. For example, the first sacrificial layer 70 may be formed by forming a polysilicon layer to a uniform thickness on an entire surface of the substrate 10 having the first trench 40 and removing the polysilicon layer to be planarized using chemical mechanical polishing in order to expose the first interlayer insulating film 50, leaving the polysilicon layer in the first trench 40.

Alternatively, in order to form the first sacrificial layer 70, the polysilicon layer is isotropically removed through a wet etching process or a dry etching process using a photoresist pattern or a second hard mask layer selectively exposing the bottom of the first trench 40 as an etch mask to form the polysilicon layer on the bottom of the first trench 40 in a pool shape. In this case, the first sacrificial layer 70 on the bottom of the first trench 40 may be partially removed through a wet etching process or a dry etching process using a strong acid solution containing a mixture of a sulphuric acid and a nitric acid as an etching solution or using a fluorocarbon gas such as a CxFy gas or a CaHbFc gas as a reactive gas. The fluorocarbon gas may be for example $CF_4$, $CHF_3$, $C_2F_6$, $C_4F_8$, $CH_2F_2$, $CH_3F$, $CH_4$, $C_2H_2$, $C_4F_6$ or a mixture thereof.

Figure 9E:
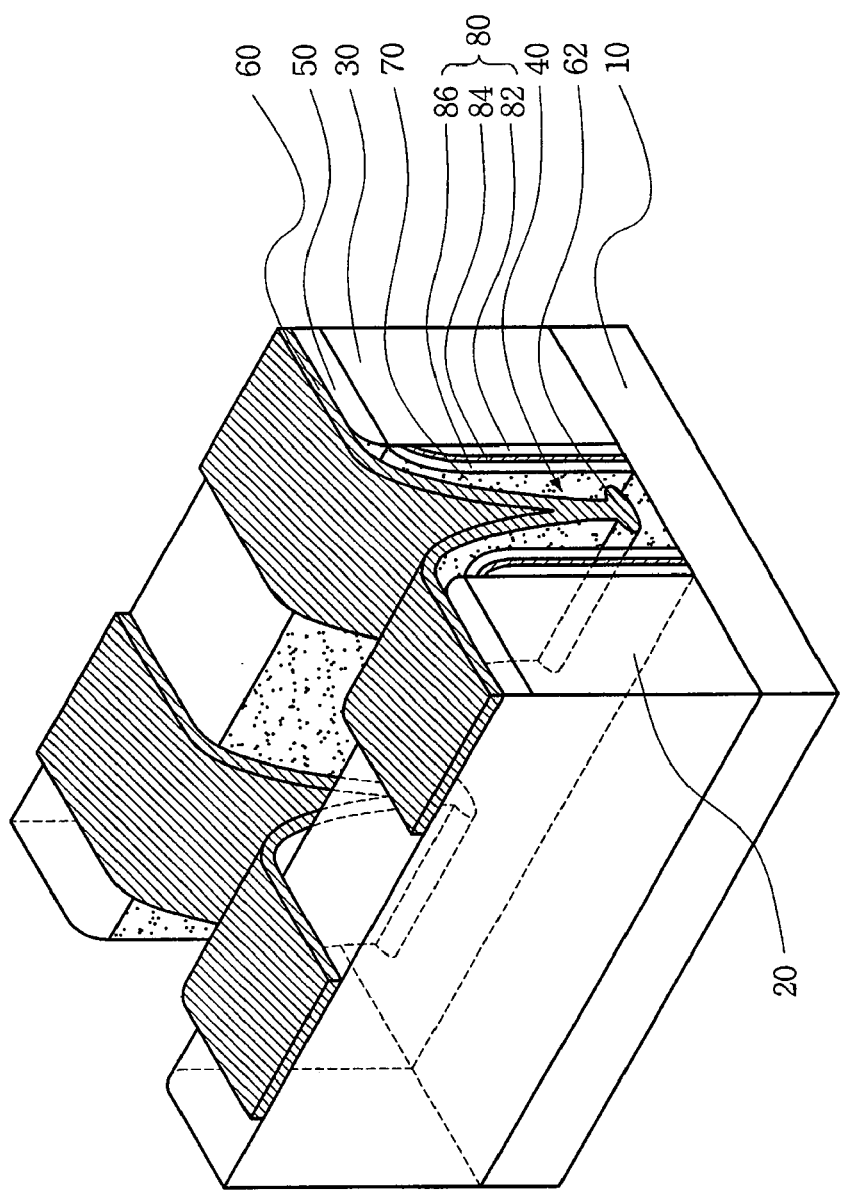
Figure 10E:
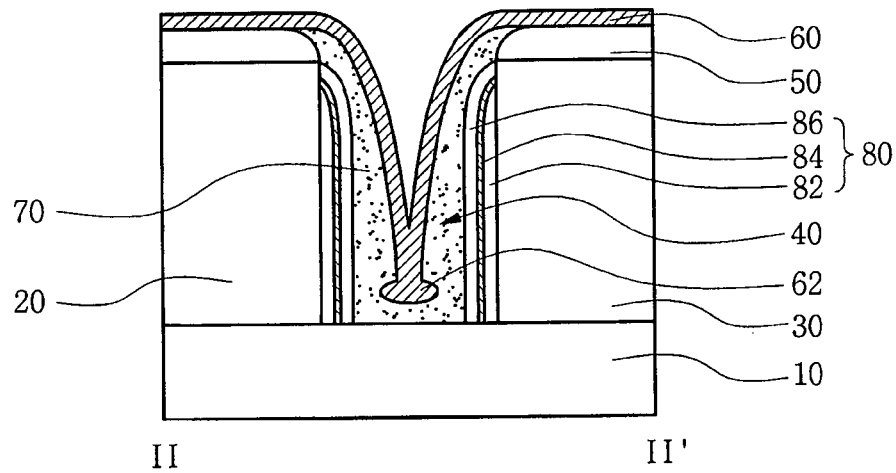

Referring to FIGS. 9E and 10E, the bit line 60 is formed to a predetermined line width on the first interlayer insulating film 50 and the first sacrificial layer 70 to intersect the first and second word lines 20 and 30. Here, the bit line 60 includes titanium, titanium nitride layer, or carbon nanotube formed by physical vapor deposition, chemical vapor deposition, or an electrical discharging method. For example, the bit line 60 may be formed by forming the titanium, the titanium nitride layer, or the carbon nanotube on the entire surface of the substrate 10 having the first sacrificial layer 70 and anisotropically removing the titanium, the titanium nitride layer, or the carbon nanotube using a dry etching process using a photoresist pattern or a second hard mask layer shielding the titanium, the titanium nitride layer, or the carbon nanotube in a direction intersecting the first and second word lines 20 and 30 as an etch mask. The photoresist pattern may be then removed by an ashing process, and the second hard mask layer may be removed at a predetermined etch rate by the reactive gas used upon forming the bit line 60. In this case, the bit line 60 is formed to be inserted into the first trench 40 along the surface of the first sacrificial layer 70, which is formed to surround the first trench 40. The bit line 60 may have a left and right symmetrical structure including a clock-pendulum-shaped or medal-shaped tip 62, having lateral extensions, and having a certain volume located in the groove of the first sacrificial layer 70 adjacent to the bottom of the first trench 40.

Thus, in the method for fabricating a memory device according to the second embodiment of the present invention, the plurality of charge trapping structures 80 are symmetrically formed on the both sidewalls of the first trench 40 formed between the first word line 20 and the second word line 30, and the bit line 60 inserted into the center of the plurality of charge trapping structures 80 is formed, resulting in a structure in which the plurality of charge trapping structures 80 and the first and second word lines 20 and 30 are symmetrical with respect to the bit line 60. Thus, it is possible to increase or maximize reliability and production yield.

Figure 9F:
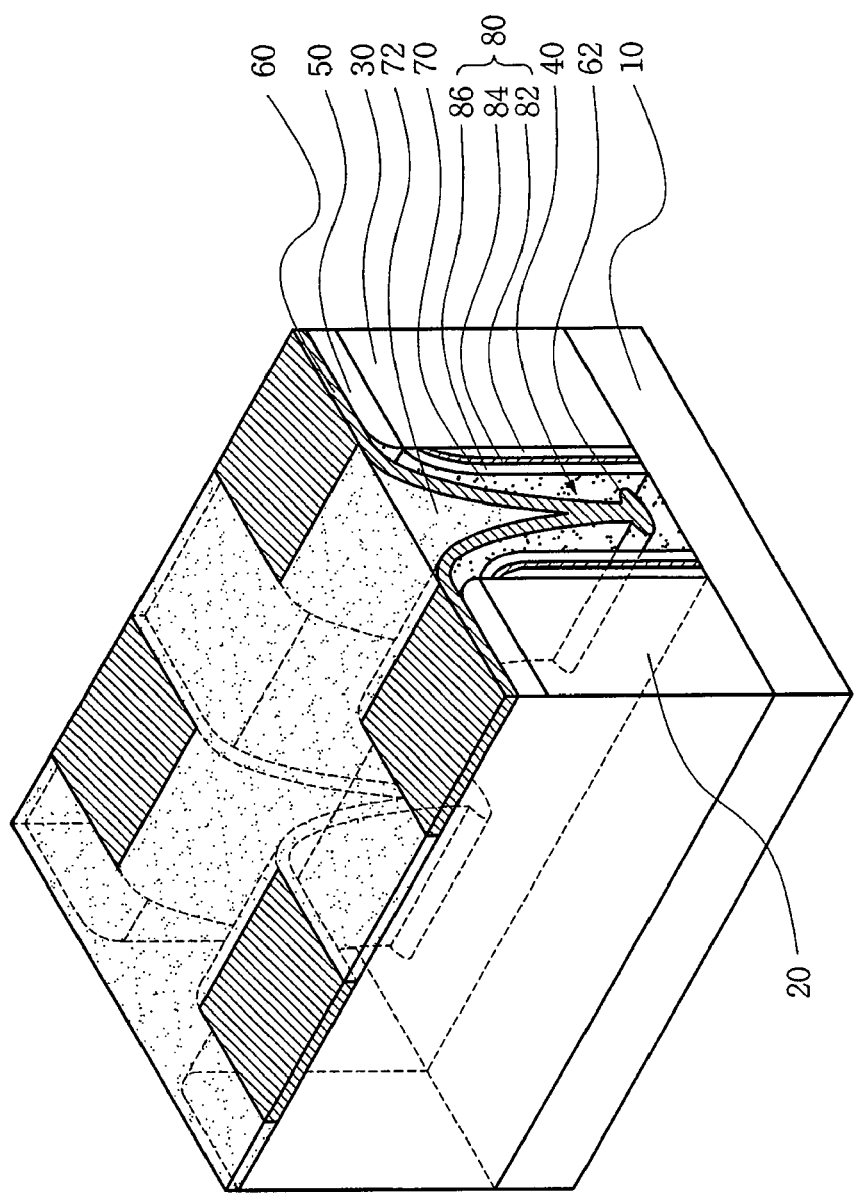
Figure 10F:
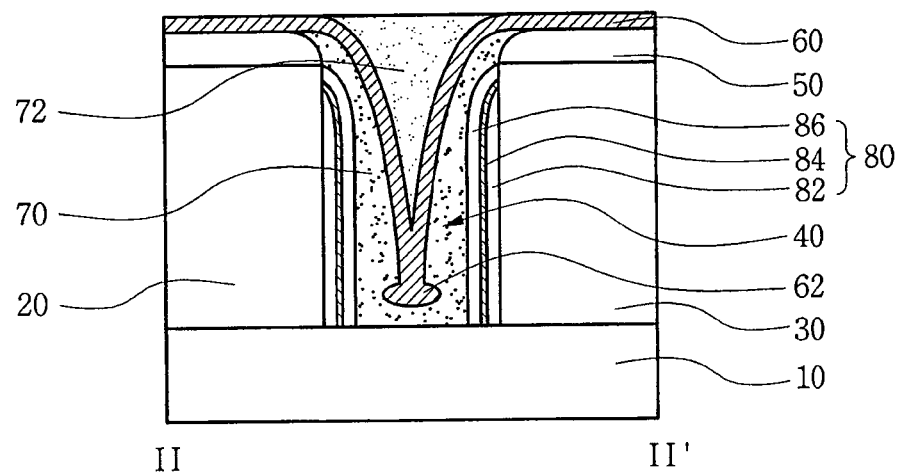

Referring to FIGS. 9F and 10F, the second sacrificial layer 72 is formed which surrounds top and side surfaces of the bit line 60 in the first trench 40 and buries the side surfaces of the bit line 60 on the first interlayer insulating film 50. The second sacrificial layer 72 includes, for example, a polysilicon layer formed by atomic layer deposition or chemical vapor deposition. For example, the second sacrificial layer 72 may be formed in a structure surrounding the top and side surfaces of the bit line 60 in the first trench 40 by forming the polysilicon layer on the entire surface of the substrate 10 to bury the first trench 40 having the bit line 60 and removing the polysilicon layer to be planarized using chemical mechanical polishing in order to expose the bit line 60.

Figure 9G:
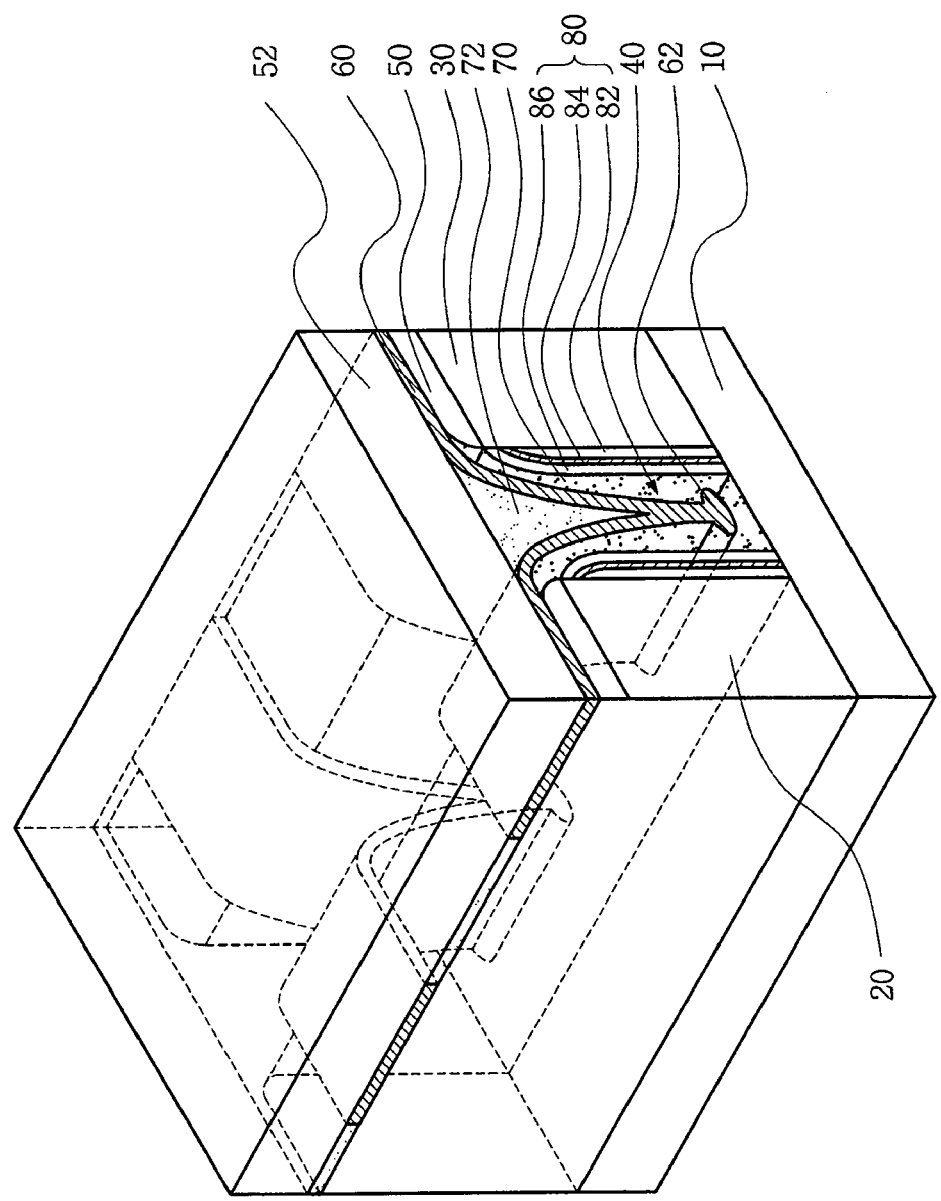
Figure 10G:
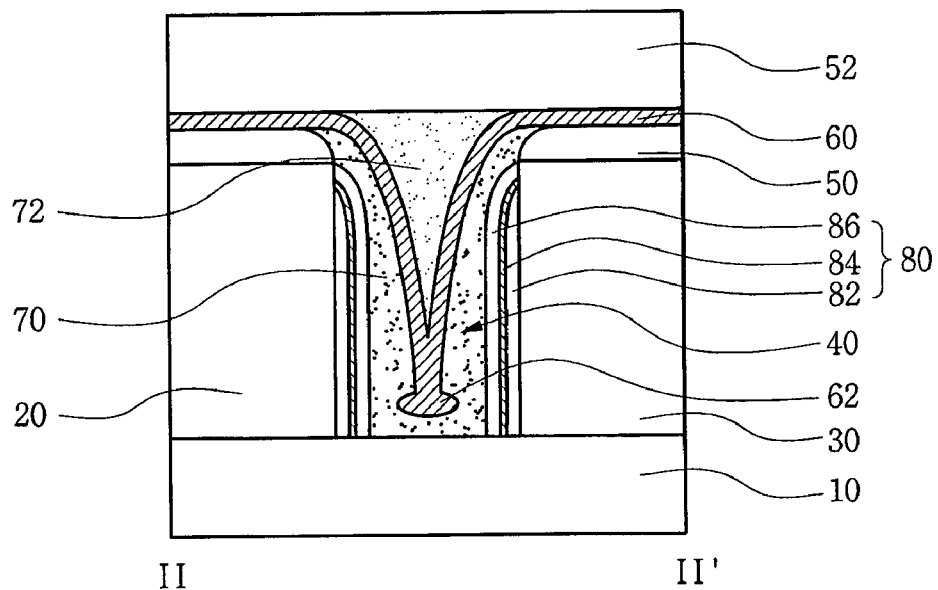

Referring to FIGS. 9G and 10G, the second interlayer insulating film 52 is formed to a predetermined thickness on the entire surface of the substrate 10 having the second sacrificial layer 72. For example, the second interlayer insulating film 52 includes a silicon oxide layer or silicon nitride layer formed to a thickness of about 200 Å to about 800 Å by chemical vapor deposition. The second interlayer insulating film 52 serves as a roof during fabrication that forms a gap on the bit line 60 when the second sacrificial layer 72 is subsequently removed and that prevents any insulating layer or metal layer formed on the bit line 60 from being grown inside the gap.

Figure 9H:
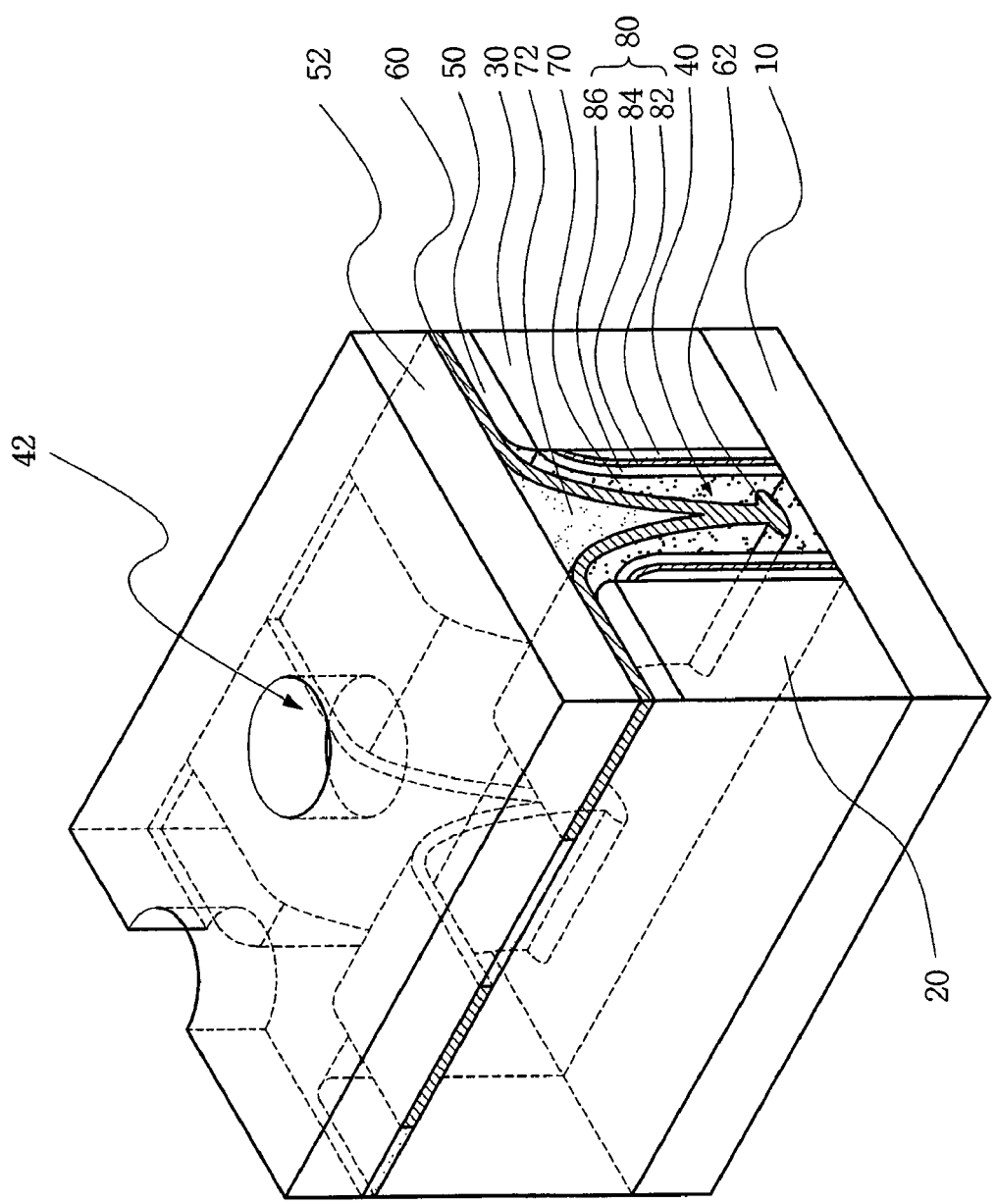
Figure 10H:
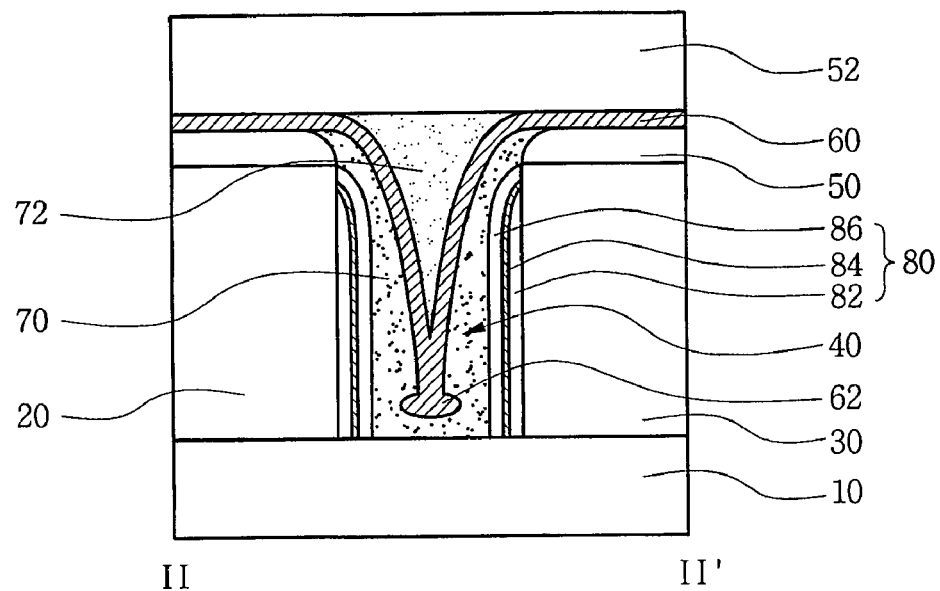

Referring to FIG. 9H or 10H, the second interlayer insulating film 52 located over the first trench 40 and spaced apart from both edges of the bit line 60 by a certain distance is removed to form the second trench 42. Here, the second trench 42 is an opening that is used to supply the etching solution or the reactive gas under the second interlayer insulating film 52 in order to subsequently remove the first sacrificial layer 70 and/or the second sacrificial layer 72 under the second interlayer insulating film 52. For example, the second trench 42 is formed by removing the second interlayer insulating film 52 at both sides of the bit line 60 using a photoresist pattern shielding the second interlayer insulating film 52 on the bit line 60 as an etch mask, in order to expose the second sacrificial layer 72. In this case, the second trench 42 may be formed to expose the first sacrificial layer 70 or the substrate 10 in the first trench 40, or the charge trapping structure 80 corresponding to the edges of the bit line 60 in the first trench 40 and brought into contact with the first and second word lines 20 and 30 may be removed to expose the sidewalls of the first trench 40.

Figure 9I:
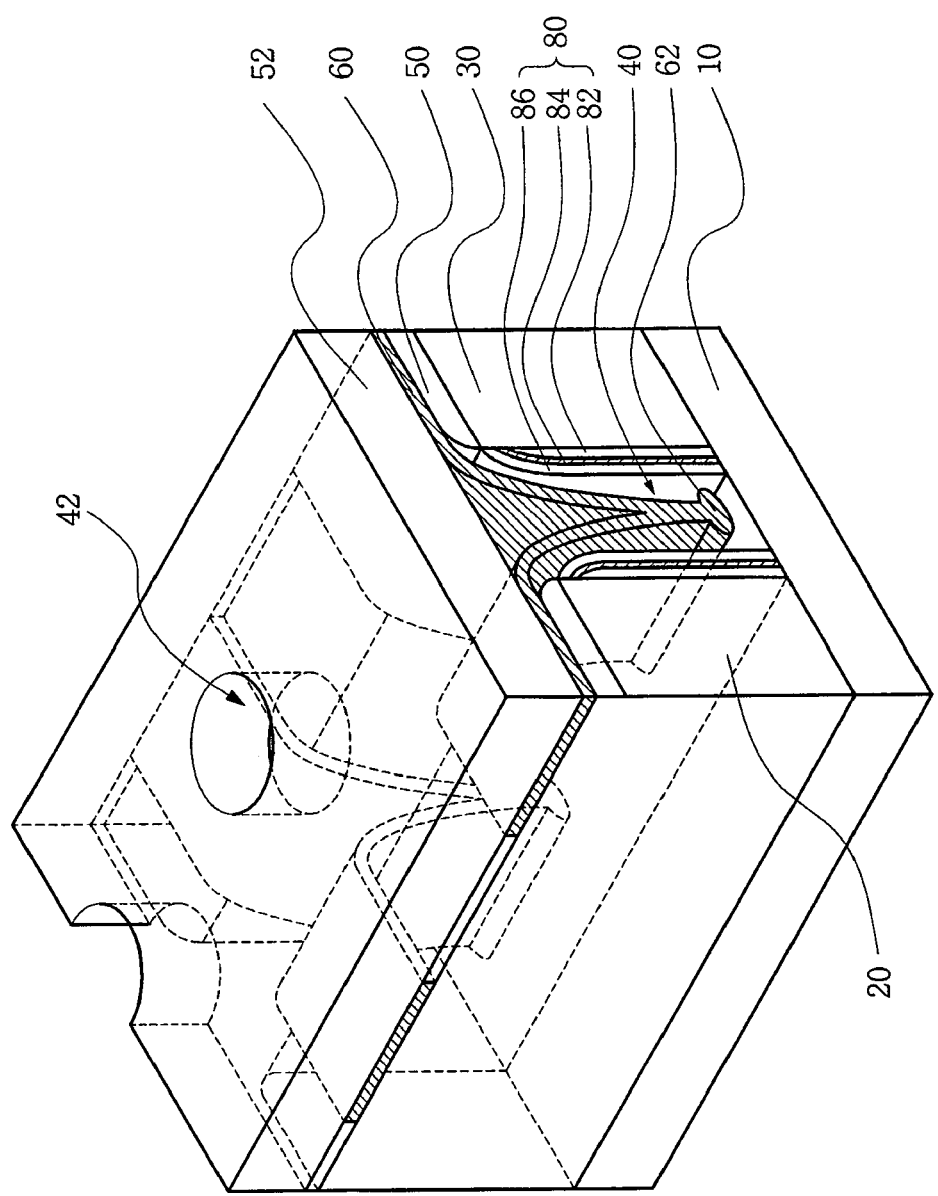
Figure 10I:
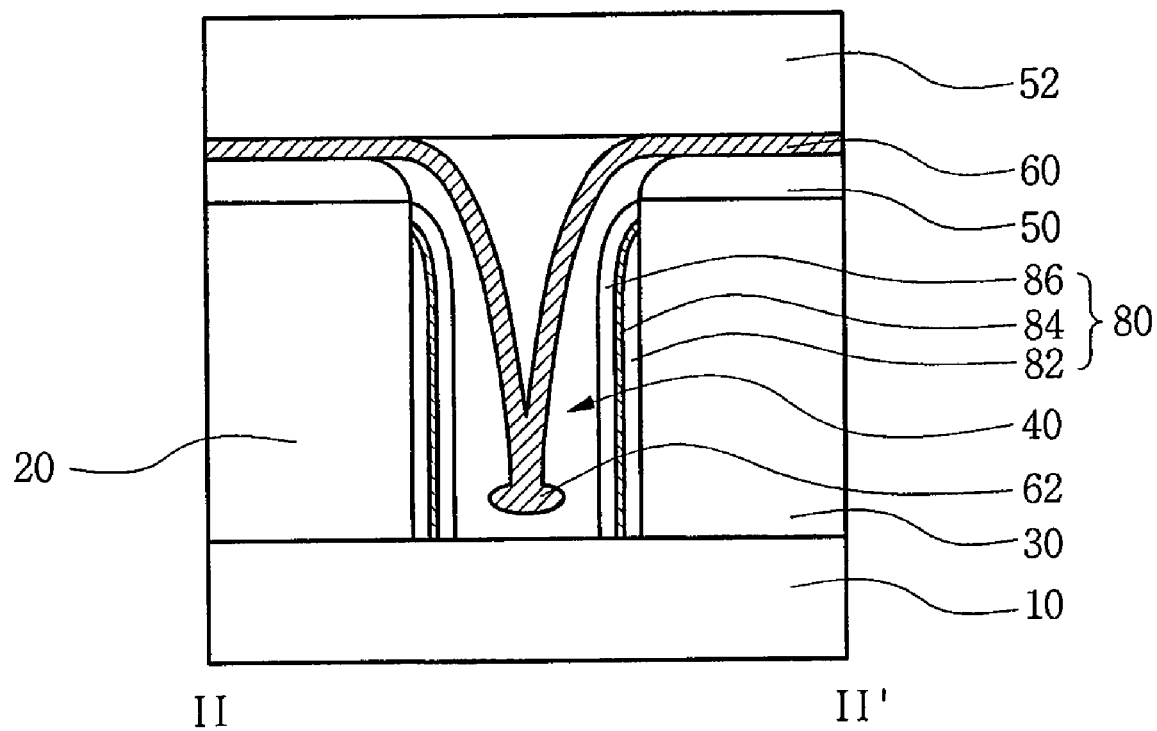

Referring to FIGS. 9I and 10I, the first sacrificial layer 70 and the second sacrificial layer 72 exposed at the sidewalls or bottom of the second trench 42 are isotropically removed to form the gap so that the bit line 60 floats inside the first trench 40. Here, the first sacrificial layer 70 and the second sacrificial layer 72 may be isotropically removed through a wet etching process or dry etching process. For example, the first and second sacrificial layers 70 and 72, which include the polysilicon layers, may be isotropically removed by an etching solution including a strong acid solution such as a sulphuric acid or a nitric acid flowing into the second trench 42 or by a fluorocarbon gas such as CxFy gas or CaHbFc gas as a reactive gas. In this case, the fluorocarbon gas may be for example $CF_4$, $CHF_3$, $C_2F_6$, $C_4F_8$, $CH_2F_2$, $CH_3F$, $CH_4$, $C_2H_2$, $C_4F_6$ or a mixture thereof.

Thus, in the method for fabricating a memory device according to the second embodiment of the present invention, the bit line 600 provided in the center of the gap corresponding to the distance between the plurality of charge trapping structures 80 formed on the sidewalls of the first trench 40 between the first word line 20 and the second word line 30 while intersecting the first word line 20 and the second word line 30 is formed so that the device is symmetrical over a certain distance at both sides of the bit line 60. Thus, it is possible to increase or maximize the reliability and production yield.

In addition, the tip 62 of the bit line 60 inserted into the center of the gap corresponding to the distance between the plurality of charge trapping structures 80, which are formed on the sidewalls of the first trench 40 between the first word line 20 and the second word line 30, is formed in the clock-pendulum shape or medal shape, having lateral extensions. This reduces the bending distance of the bit line 60, or the distance between the rest position and a position in a point of contact with either the first word line 20 or second word line 30, resulting from the switching operation, and consumption of power for data writing operations corresponding to the bending distance of the bit line 60 decreases. Thus, it is possible to increase or maximize the efficiency of the memory device.

As described above, according to the embodiments of the present invention, the bit line inserted into the center of the gap corresponding to the first trench formed between the first word line and the second word line, while intersecting the first word line and the second word line, is formed so that the device is symmetrical over a certain distance at both sides of the bit line. Thus, it is possible to increase or maximize the reliability and production yield of the device.

In addition, the tip of bit line inserted into the center of the gap corresponding to the first trench formed between the first word line and the second word line is formed in a clock-pendulum shape or medal shape, having lateral extensions, thereby reducing the bending distance of the bit line resulting from switching operation and therefore consumption of power for data writing operations corresponding to the bending distance of the bit line. Thus, it is possible to increase or maximize efficiency of the memory device.

Furthermore, the bit line having the clock-pendulum-shaped or medal-shaped tip, with lateral extensions, which is bent toward the first word line or the second word line when inserted into the first trench formed between the first word line and the second word line, can be electrostatically fixed by the charge trapping structure for trapping charge applied by the first word line and the second word line, thereby reducing consumption of standby power needed for storing information and preventing loss of information even when charge is not supplied through the first word line and the second word line. Thus, it is possible to implement a nonvolatile memory device.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A memory device comprising:
   a plurality of word lines formed with a gap therebetween and extending in parallel with each other in a first direction of extension; and
   a bit line insulated from the plurality of word lines, intersecting the plurality of word lines and extending in a second direction of extension, a transition electrode portion of the bit line positioned in the gap and spaced apart from the plurality of word lines by a predetermined distance, the transition electrode portion of the bit line configured and arranged to be bent toward any one of the plurality of word lines in response to an electrical signal applied to at least one of the plurality of word lines.

2. The device according to claim 1, wherein the transition electrode portion of the bit line comprises a clock-pendulum-shaped or medal-shaped tip inserted into the gap.

3. The device according to claim 2 wherein the tip of the transition electrode portion of the bit line includes lateral extensions that extend in a direction toward at least one of the plurality of word lines.

4. The device according to claim 1, further comprising charge trapping structures formed on sidewalls of the plurality of word lines in the gap between the plurality of word lines and the transition electrode portion of the bit line, wherein the charge trapping structures trap charge so that the transition electrode portion of the bit line can be retained in a bent position toward any one of the plurality of word lines in an electrostatically fixed manner.

5. The device according to claim 4 wherein the memory device comprises a non-volatile memory device and wherein the charge trapping structures trap charge so that the transition electrode portion of the bit line can be retained in a bent position toward any one of the plurality of word lines in an electrostatically fixed manner, despite removal of a power supply that supplies power to the device.

6. A memory device comprising:
   a substrate;
   a plurality of word lines on the substrate and spaced apart from each other by a predetermined interval and extending in parallel with each other in a first direction of extension on the substrate;
   a trench exposing the substrate between the plurality of word lines;
   a first interlayer insulating film on the plurality of word lines; and
   a bit line on the first interlayer insulating film intersecting the plurality of word lines and extending in a second direction of extension, the bit line insulated from the plurality of word lines by the first interlayer insulating film, a transition electrode portion of the bit line positioned in the trench and spaced apart from the plurality of word lines by a predetermined distance, the transition electrode portion of the bit line configured and arranged to be bent toward any one of the plurality of word lines in response to an electrical signal applied to the at least one of the plurality of word lines.

7. The device according to claim 6, wherein the transition electrode portion of the bit line comprises a clock-pendulum-shaped or a medal-shaped tip.

8. The device according to claim 7 wherein the tip of the transition electrode includes lateral extensions that extend in a direction toward at least one of the plurality of word lines.

9. The device according to claim 6, further comprising charge trapping structures formed on sidewalls of the plurality of word lines in the trench between the plurality of word lines and the transition electrode portion of the bit line, wherein the charge trapping structures trap charge so that the transition electrode portion of the bit line can be retained in a bent position toward any one of the plurality of word lines in an electrostatically fixed manner.

10. The device according to claim 9 wherein the memory device comprises a non-volatile memory device and wherein the charge trapping structures trap charge so that the transition electrode portion of the bit line can be retained in a bent position toward any one of the plurality of word lines in an electrostatically fixed manner, despite removal of a power supply that supplies power to the device.

11. The device according to claim 9, wherein the charge trapping structure comprises a first silicon oxide layer, a silicon nitride layer or polysilicon layer, and a second silicon oxide layer sequentially stacked on sidewalls of the trench.

12. The device according to claim 9, wherein the charge trapping structure is in a circular arc shape that protrudes from the both sidewalls of the trench or in a rod shape that is in parallel with the plurality of word lines.

13. The device according to claim 6, wherein the substrate comprises an insulating substrate or a semiconductor substrate.

14. The device according to claim 6, wherein the first interlayer insulating film comprises a silicon oxide layer or a silicon nitride layer.

15. The device according to claim 6, wherein the bit line comprises titanium, titanium nitride layer, or carbon nanotube.

16. The device according to claim 6, wherein the plurality of word lines comprises gold, silver, copper, aluminum, tungsten, tungsten silicide, titanium, titanium nitride, tantalum, or tantalum silicide.

17. The device according to claim 6, further comprising a second interlayer insulating film that covers an entire surface of the substrate wherein a gap is present between the second interlayer insulating film and the transition electrode portion of the bit line in the trench.

* * * * *